United States Patent [19]
Gardner et al.

[11] Patent Number: 5,805,619
[45] Date of Patent: Sep. 8, 1998

[54] METHOD AND APPARATUS FOR SAMPLED-DATA PARTIAL-RESPONSE SIGNAL TIMING ERROR DETECTOR HAVING ZERO SELF-NOISE

[75] Inventors: Floyd Martin Gardner, Palo Alto; Dennis Allen Saxby, Ben Lomond, both of Calif.

[73] Assignee: Swan Magnetics, Inc., San Jose, Calif.

[21] Appl. No.: 602,218

[22] Filed: Feb. 16, 1996

[51] Int. Cl.$^6$ .......................... H04L 25/497; G11B 27/19
[52] U.S. Cl. ................ 371/61; 360/51; 375/376
[58] Field of Search ................ 371/61; 360/51; 375/376

[56] References Cited

U.S. PATENT DOCUMENTS

| | | | |
|---|---|---|---|
| 5,132,988 | 7/1992 | Fisher et al. | 375/233 |
| 5,216,554 | 6/1993 | Schneider | 360/51 |
| 5,258,933 | 11/1993 | Johnson et al. | 364/602 |
| 5,341,249 | 8/1994 | Abbott et al. | 360/46 |
| 5,422,760 | 6/1995 | Abbott et al. | 360/46 |
| 5,442,492 | 8/1995 | Cunningham et al. | 360/46 |
| 5,552,942 | 9/1996 | Ziperovich et al. | 360/51 |
| 5,642,243 | 6/1997 | Bliss | 360/51 |

OTHER PUBLICATIONS

R.W. Wood and D.A. Peterson, "Viterbi Detection of Class IV Partial Response on a Magnetic Recording Channel," IEEE Trans. Comm., vol. COM–34, pp. 454–461, May 1986.
F.M. Gardner, "Interpolation and Digital Modems, Part I —Fundamentals".
L. Erup, F.M. Gardner, and R.A. Harris, "Interpolation in Digital Modems, Part II —Implementation".
E.R. Kretzmer, "Generalization of a Technique for Binary Data Communication".
P. Kabal and S. Pasupathy, "Partial Response Signaling".
J.M. Cioffi et al., "On The Combination of Equalization and Coding in Saturation Recording".
J.A. Thomas, "A Simple Method of Clock Extraction for a Correlative Pulse Sequence".
J.A.C. Bingham, "Theory and Practice of Modem Design".
F.M. Gardner, "A BPSK/QPSK Timing–Error Detector for Sampled Receivers".
L.E. Franks, "Carriers and Bit Synchronization in Data Communications —A Tutorial Review," IEEE Trans. Comm., vol. COM–28, pp. 1107–1121, Aug. 1980.
H. Sailer, "Timing Recovery in Data Transmission Systems Using Multilevel Partial Response Signaling".
S.U.H. Qureshi, "Timing Recovery for Equalized Partial Response Systems".

(List continued on next page.)

*Primary Examiner*—Stephen M. Baker
*Attorney, Agent, or Firm*—Flehr Hohbach Test Albritton & Herbert LLP; R. Michael Ananian

[57] ABSTRACT

Apparatus and method for sampling a partial response input signal including a signal sampler for generating a sampled digital signal representation of a sampled analog signal in response to a sample-time control signal, and a timing error detector having an input port receiving the digital signal and generating a timing error control signal at an output port. The timing error control signal is a function of the non-return to zero (NRZ) sequence which was originally recorded or otherwise transmitted or communicated, the synchronous sampled data value, the estimated ideal partial response sample value, and the timing error estimate. A voltage controlled oscillator (VCO) receives the timing error control signal and generates the sample time control signal. Several multi-level data estimators are described. Capability to perform digital signal processing at the incoming data rate is provided so that the approach can be used in a real-time hardware testing environment suitable for data reception over a communication channel, and finds particular utility for magnetic disk data read channel testing. The timing error detector also estimates a binary data value based on the non-return to zero (NRZ) sequence, rather than on an amplitude sequence as are some conventional partial response signal detection algorithms.

25 Claims, 27 Drawing Sheets

OTHER PUBLICATIONS

J.W.M. Bergmans and H.W. Wong–Lam, "A Class of Data–Aided Timing–Recovery Schemes".

K.H. Mueller and M. Muller, "Timing Recovery in Digital Synchronous Digital Synchronous Data Receivers".

F. Dolvio, W. Schott and G. Ungerbock, "Fast Timing Recovery for Partial Response Signaling Systems".

R.D. Cideciyan et al., "A PRML System for Digital Magnetic Recording," IEEE J. on Selected Areas in Comm., vol. 10, pp. 38–56, Jan. 1992.

W.L. Abott and J.M. Cioffi, "Timing Recovery for Adaptive Decision Feedback Equalization of the Magnetic Storage Channel".

F.M. Gardner, "Self Noise in Synchronizers".

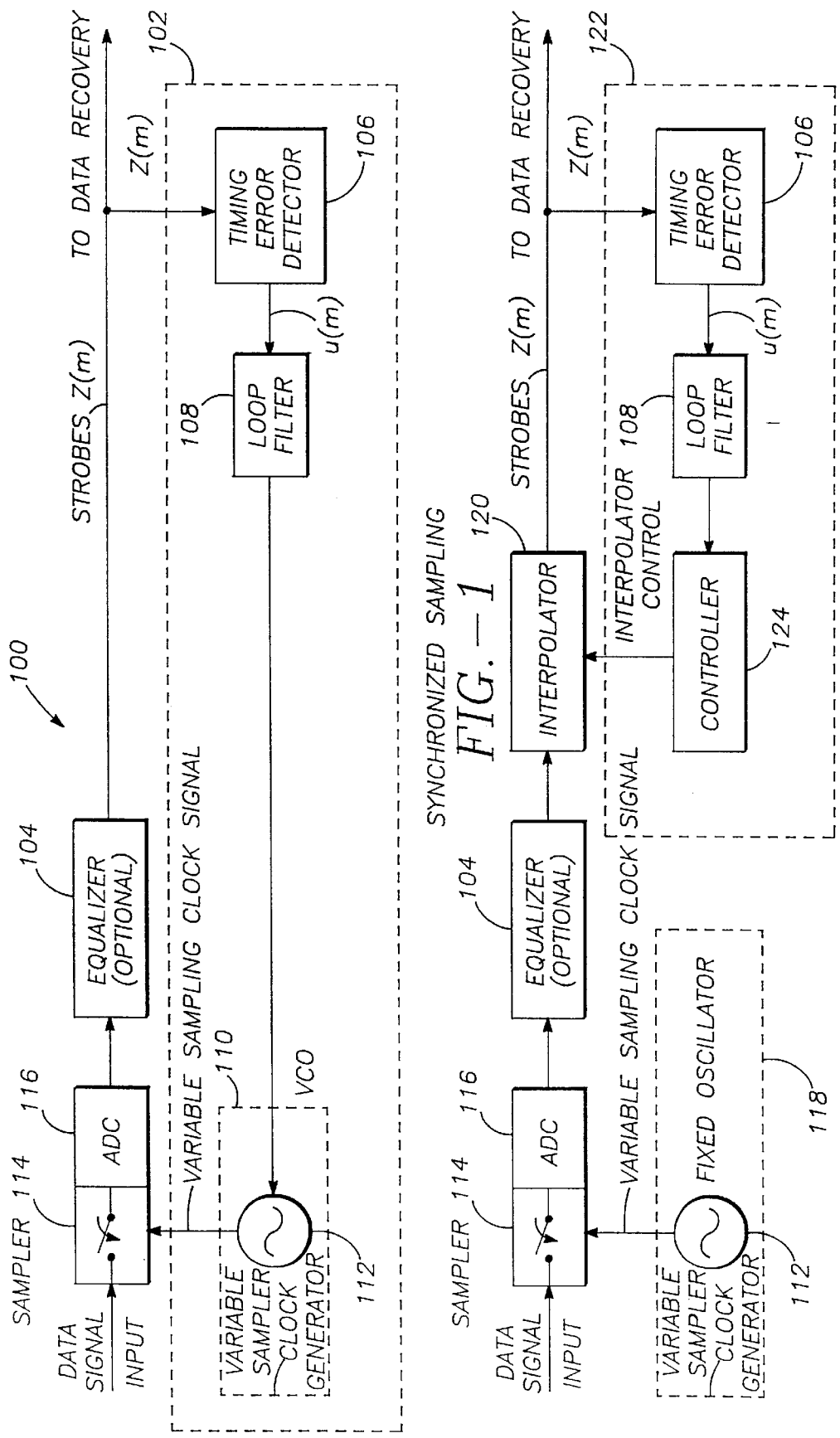

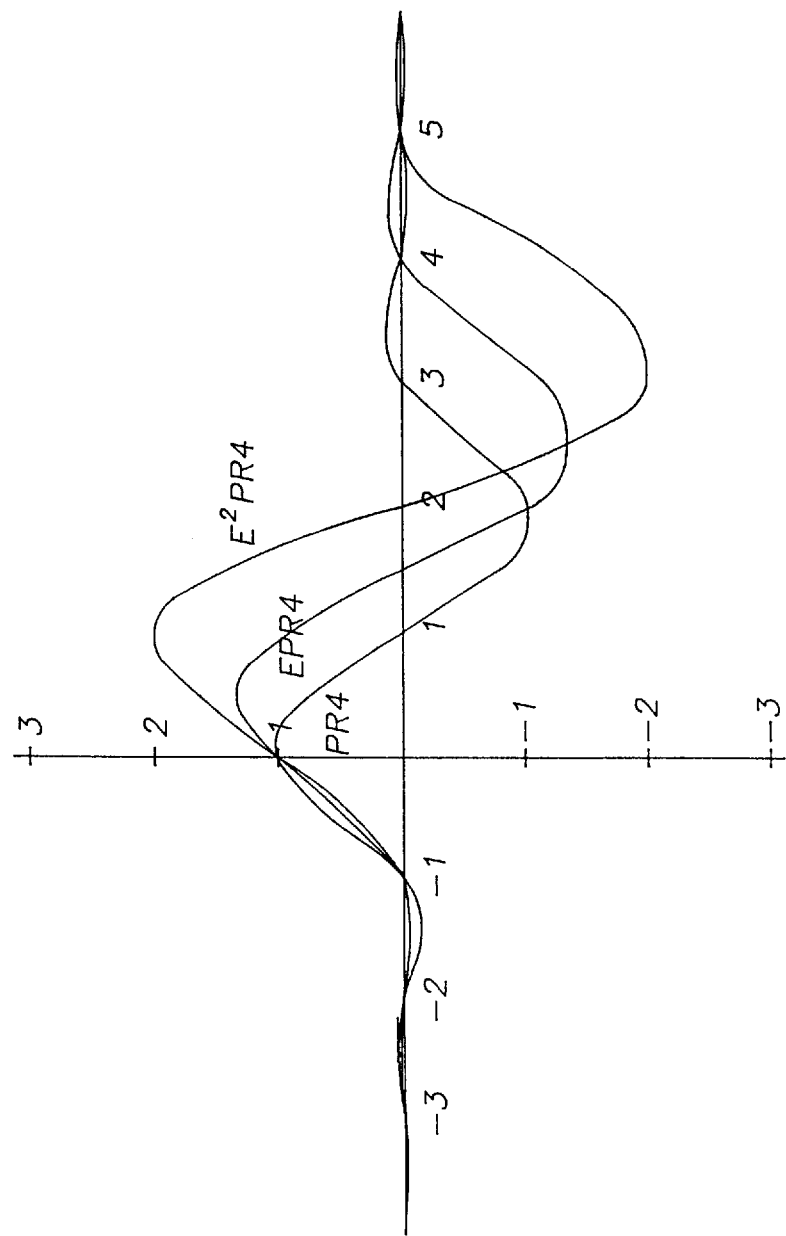

FIG.-7 BLOCK DIAGRAM OF 1ST EMBODIMENT OF TIMING-ERROR DETECTOR

FIG.-8  BLOCK DIAGRAM OF 2ND EMBODIMENT OF TIMING-ERROR DETECTOR

FIG.-9 BLOCK DIAGRAM OF 3RD EMBODIMENT OF TIMING-ERROR DETECTOR

MEAN OUTPUT OF TIMING ERROR DETECTOR; PR4 SIGNAL.

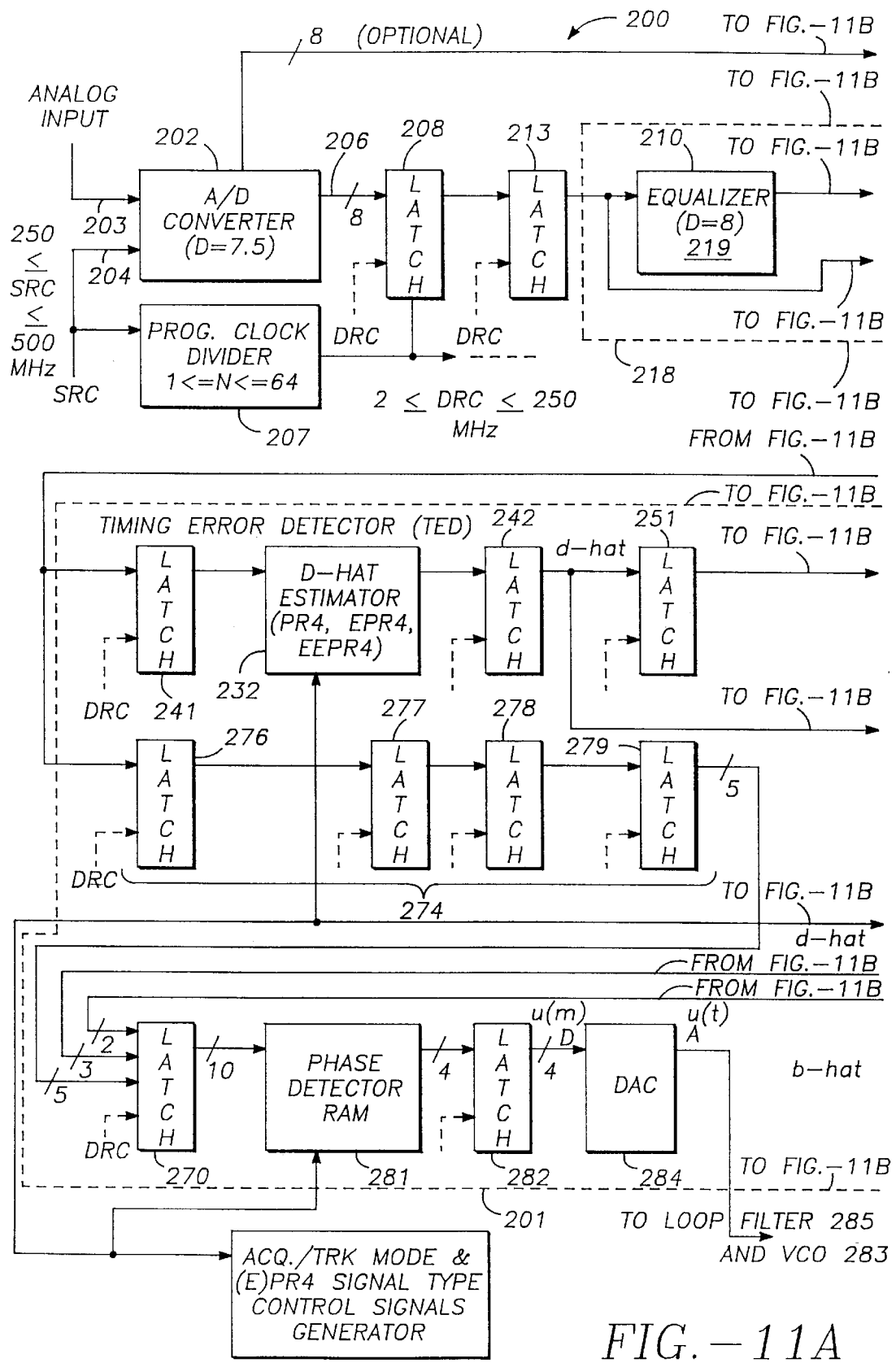
FIG.—11A

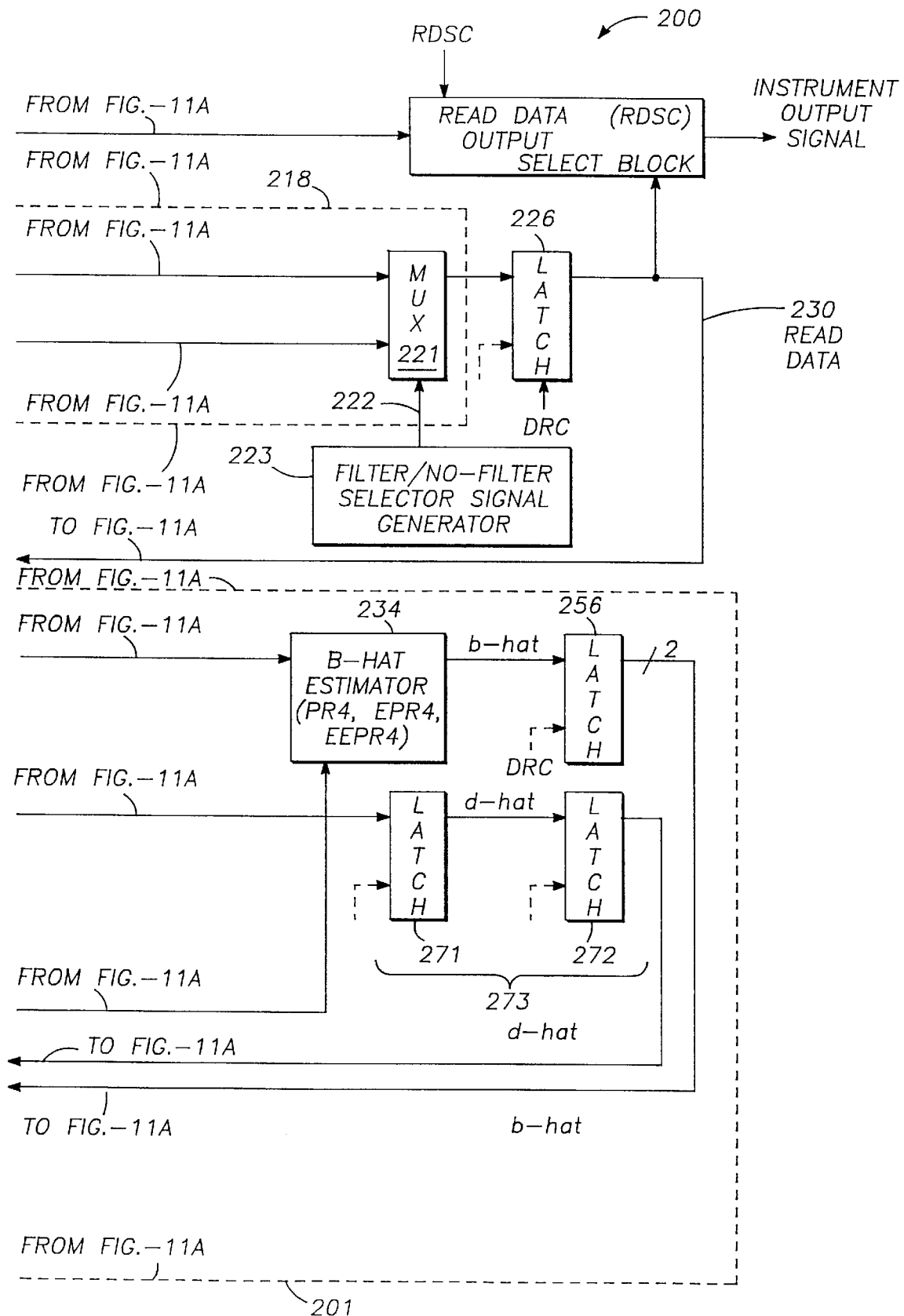
FIG.−11B

Exemplary EEPR4 Phase-Locked Loop ECL D-HAT RAM Equations:

The D-HAT RAM's output is the estimated the ideal sample value encoded in a 4 bit nibble.

$A_{7:0}$=The ADC output; $A_8$=don't care; $A_9$=Mode control (0=acquisition mode, 1=tracking)

Table II. D-HAT RAM Address Ranges and Data Output Values.

| | RAM ADDRESS RANGE AND ADDRESS BIT DESIGNATION | | | | | | | | | | DATA OUTPUT VALUE |
|---|---|---|---|---|---|---|---|---|---|---|---|
| | $A_9$ | $A_8$ | $A_7$ | $A_6$ | $A_5$ | $A_4$ | $A_3$ | $A_2$ | $A_1$ | $A_0$ | |
|  | 0 | X | 0 | 0 | 0 | 0 | 0 | 0 | 0 | 0 | 0 |
| through | 0 | X | 0 | 0 | 1 | 1 | 1 | 1 | 1 | 1 | |
|  | 0 | X | 0 | 1 | 0 | 0 | 0 | 0 | 0 | 0 | 1 |
| through | 0 | X | 0 | 1 | 0 | 0 | 0 | 1 | 1 | 1 | |
|  | 0 | X | 0 | 1 | 0 | 0 | 1 | 0 | 0 | 0 | 2 |
| through | 0 | X | 0 | 1 | 0 | 1 | 1 | 1 | 1 | 1 | |
|  | 0 | X | 0 | 1 | 1 | 0 | 0 | 0 | 0 | 0 | 3 |
| through | 0 | X | 1 | 0 | 0 | 1 | 1 | 1 | 1 | 1 | |
|  | 0 | X | 1 | 0 | 1 | 0 | 0 | 0 | 0 | 0 | 4 |
| through | 0 | X | 1 | 0 | 1 | 1 | 0 | 1 | 1 | 1 | |
|  | 0 | X | 1 | 0 | 1 | 1 | 1 | 0 | 0 | 0 | 5 |
| through | 0 | X | 1 | 0 | 1 | 1 | 1 | 1 | 1 | 1 | |
|  | 0 | X | 1 | 1 | 0 | 0 | 0 | 0 | 0 | 0 | 6 |
| through | 0 | X | 1 | 1 | 1 | 1 | 1 | 1 | 1 | 1 | |
|  | 1 | X | 0 | 0 | 0 | 0 | 0 | 0 | 0 | 0 | 0 |
| through | 1 | X | 0 | 0 | 1 | 0 | 1 | 1 | 1 | 1 | |
|  | 1 | X | 0 | 0 | 1 | 1 | 0 | 0 | 0 | 0 | 1 |
| through | 1 | X | 0 | 1 | 0 | 0 | 1 | 1 | 1 | 1 | |
|  | 1 | X | 0 | 1 | 0 | 1 | 0 | 0 | 0 | 0 | 2 |
| through | 1 | X | 0 | 1 | 1 | 0 | 1 | 1 | 1 | 1 | |
|  | 1 | X | 0 | 1 | 1 | 1 | 0 | 0 | 0 | 0 | 3 |
| through | 1 | X | 1 | 0 | 0 | 0 | 1 | 1 | 1 | 1 | |
|  | 1 | X | 1 | 0 | 0 | 1 | 0 | 0 | 0 | 0 | 4 |
| through | 1 | X | 1 | 0 | 1 | 0 | 1 | 1 | 1 | 1 | |
|  | 1 | X | 1 | 0 | 1 | 1 | 0 | 0 | 0 | 0 | 5 |
| through | 1 | X | 1 | 1 | 0 | 0 | 1 | 1 | 1 | 1 | |
|  | 1 | X | 1 | 1 | 0 | 1 | 0 | 0 | 0 | 0 | 6 |
| through | 1 | X | 1 | 1 | 1 | 1 | 1 | 1 | 1 | 1 | |

*FIG. - 13*

Exemplary E²PR4 Phase-Locked Loop ECL B-HAT RAM Equations:

$A_n$ is address bit `n'. $D_n$ is data bit `n'.

Output definitions: $D_0$=bhat(m), $D_1$=bhat(m-2), $D_2$=bhat(m-3), and $D_3$=bhat(m-4)

B-Hat Address definitions: $A_{3:0}$=dhat(m), $A_4$=bhat(m-1), $A_5$=bhat(m-2), $A_6$=bhat(m-3), $A_7$=bhat(m-4), $A_8$=bhat(m-5), and $A_9$=Mode (0=Acquisition 1=Tracking mode)

Table III. B-HAT RAM Address Ranges and Data Output Values

| Address Inputs | | | | | | | | | | Data Output | | | |
|---|---|---|---|---|---|---|---|---|---|---|---|---|---|
| $A_9$ | $A_8$ | $A_7$ | $A_6$ | $A_5$ | $A_4$ | $A_3$ | $A_2$ | $A_1$ | $A_0$ | $D_3$ | $D_2$ | $D_1$ | $D_0$ |
| Bhat | | | | | | Dhat | | | | | | | |
| 0 | X | A | B | C | D | X | 0 | 0 | 0 | A | B | C | 0 |
| 0 | X | A | B | C | D | X | 0 | 0 | 1 | A | B | C | 0 |
| 0 | X | A | B | C | D | X | 0 | 1 | 0 | A | B | C | A |
| 0 | X | A | B | C | D | X | 0 | 1 | 1 | A | B | C | A |
| 0 | X | A | B | C | D | X | 1 | 0 | 0 | A | B | C | A |
| 0 | X | A | B | C | D | X | 1 | 0 | 1 | A | B | C | 1 |
| 0 | X | A | B | C | D | X | 1 | 1 | 0 | A | B | C | 1 |
| 1 | X | A | B | C | D | X | 0 | 0 | 0 | A | B | C | 0 |
| 1 | X | A | B | C | D | X | 0 | 0 | 1 | A | B | C | A |
| 1 | X | A | B | C | D | X | 0 | 1 | 0 | A | B | C | ˜A |
| 1 | X | A | B | C | D | X | 0 | 1 | 1 | A | B | C | A |
| 1 | X | A | B | C | D | X | 1 | 0 | 0 | A | B | C | ˜A |
| 1 | X | A | B | C | D | X | 1 | 0 | 1 | A | B | C | A |
| 1 | X | A | B | C | D | X | 1 | 1 | 0 | A | B | C | 1 |

FIG. - 15

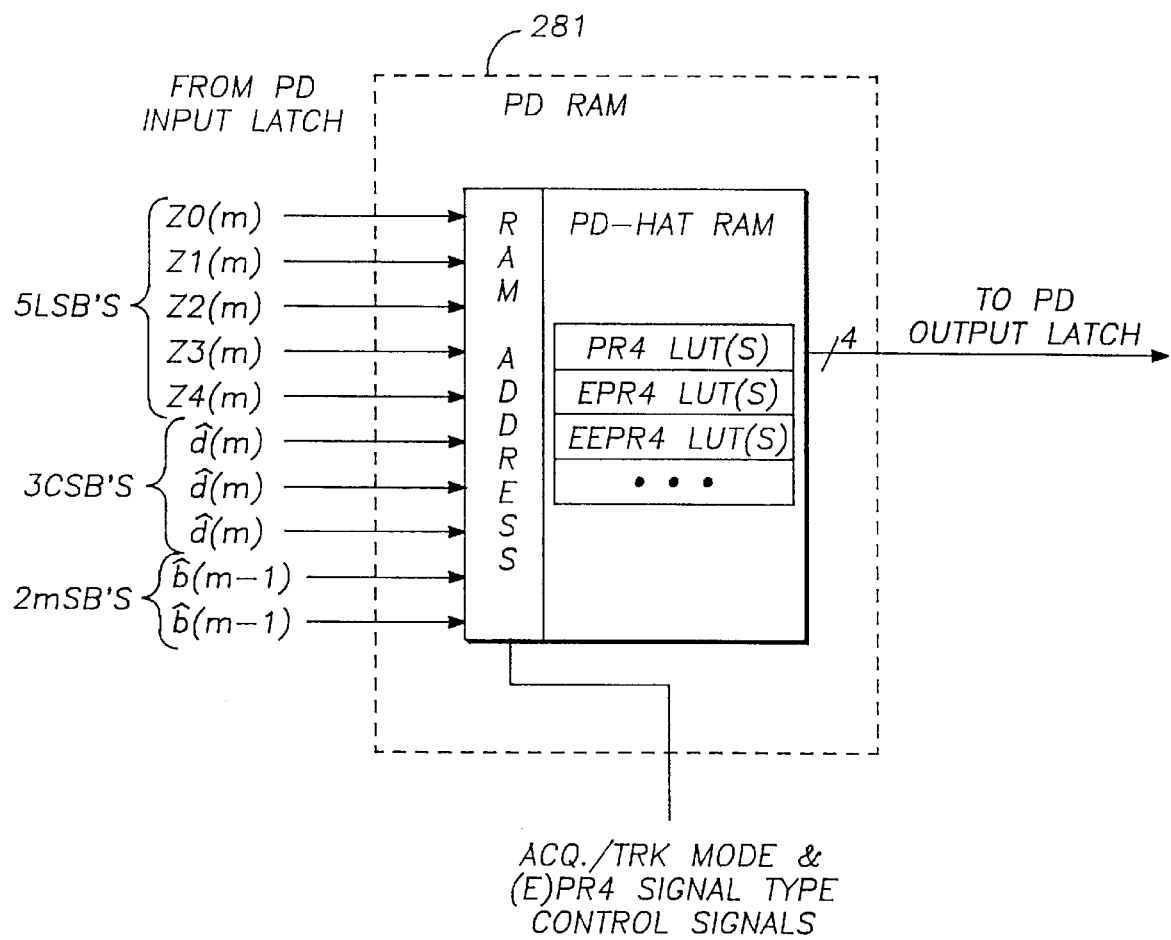
FIG.−16

Implemetation of the equation u(m)=BHAT(m-2)[Z(m)-DHAT(m)]

$A_0$=RDAT$_5$  $A_{1:4}$=RDAT$_{1:4}$  $A_{5:7}$=Dhat$_{0:3}$  $A_8$=Bhat$_1$(Change sign of output if equal to 1)
$A_9$=Mode (0=Acquisition, 1=Tracking); S=sign bit; RDAT is the read data.
$D_{0:3}$ = 2's complement, where 0 is MSB, 3 is LSB Table IV. Phase Detector PD-RAM Address Ranges and Data Output Values

| $A_9$ | $A_8$ | $A_7$ | $A_6$ | $A_5$ | $A_4$ | $A_3$ | $A_2$ | $A_1$ | $A_0$ | Output |
|---|---|---|---|---|---|---|---|---|---|---|
| | Bhat | | Dhat | | | | Rdata | | | |
| 0 | S | 0 | 0 | 0 | 0 | 0 | 0 | 0 | 0 | (15-0:7)/3 |
| through 0 | S | 0 | 0 | 1 | 0 | 0 | 0 | 1 | 1 | Note: Truncate output to ±7 if necessary. If A8=1, change sign |
| 0 | S | 0 | 1 | 0 | 0 | 0 | 1 | 0 | 0 | (95-0:7)/3 |
| through 0 | S | 0 | 1 | 0 | 0 | 1 | 1 | 1 | 1 | Note: Truncate output to ± 7 if necessary. If A8=1, change sign |
| 0 | S | 0 | 1 | 1 | 1 | 0 | 0 | 0 | 0 | (127-0:7)/3 |
| through 0 | S | 0 | 1 | 1 | 1 | 1 | 1 | 1 | 1 | Note: Truncate output to ± 7 if necessary. If A8=1, change sign |
| 0 | S | 0 | 1 | 1 | 0 | 0 | 0 | 0 | 0 | (95-0:7)/3 |
| through 0 | S | 0 | 1 | 1 | 0 | 1 | 1 | 1 | 1 | Note: Truncate output to ± 7 if necessary. If A8=1, change sign |
| 0 | S | 1 | 0 | 0 | 1 | 0 | 0 | 0 | 0 | (127-0:7)/3 |
| through 0 | S | 1 | 0 | 0 | 1 | 1 | 0 | 1 | 1 | Note: Truncate output to ± 7 if necessary. If A8=1, change sign |
| 0 | S | 1 | 0 | 1 | 1 | 1 | 1 | 0 | 0 | (207-0:7)/3 |
| through 0 | S | 1 | 1 | 0 | 1 | 1 | 1 | 1 | 1 | Note: Truncate output to ± 7 if necessary. If A8=1, change sign |
| 1 | S | 0 | 0 | 0 | 0 | 0 | 0 | 0 | 0 | (15-0:7) |
| through 1 | S | 0 | 0 | 0 | 1 | 0 | 1 | 1 | 1 | Note: Truncate output to ± 7 if necessary. If A8=1 change sign |
| 1 | S | 0 | 0 | 1 | 1 | 1 | 0 | 0 | 0 | (63-0:7) |
| through 1 | S | 0 | 0 | 1 | 1 | 1 | 1 | 1 | 1 | Note: Truncate output to ± 7 if necessary. If A8=1 change sign |
| 1 | S | 0 | 0 | 1 | 0 | 0 | 0 | 0 | 0 | (31-0:7) |
| through 1 | S | 0 | 0 | 1 | 0 | 0 | 1 | 1 | 1 | Note: Truncate output to ± 7 if necessary. If A8=1 change sign |
| 1 | S | 0 | 1 | 0 | 0 | 1 | 0 | 0 | 0 | (79-0:7) |
| through 1 | S | 0 | 1 | 0 | 0 | 1 | 1 | 1 | 1 | Note: Truncate output to ± 7 if necessary. If A8=1 change sign |
| 1 | S | 0 | 1 | 0 | 1 | 0 | 0 | 0 | 0 | (79-0:7) |
| through 1 | S | 0 | 1 | 0 | 1 | 0 | 1 | 1 | 1 | Note: Truncate output to ± 7 if necessary. If A8=1 change sign |
| 1 | S | 0 | 1 | 1 | 1 | 1 | 0 | 0 | 0 | (127-0:7) |
| through 1 | S | 0 | 1 | 1 | 1 | 1 | 1 | 1 | 1 | Note: Truncate output to ± 7 if necessary. If A8=1 change sign |
| 1 | S | 0 | 1 | 1 | 0 | 0 | 0 | 0 | 0 | (95-0:7) |
| through 1 | S | 0 | 1 | 1 | 0 | 0 | 1 | 1 | 1 | Note: Truncate output to ± 7 if necessary. If A8=1 change sign |
| 1 | S | 1 | 0 | 0 | 0 | 1 | 0 | 0 | 0 | (143-0:7) |
| through 1 | S | 1 | 0 | 0 | 0 | 1 | 1 | 1 | 1 | Note: Truncate output to ± 7 if necessary. If A8=1 change sign |
| 1 | S | 1 | 0 | 0 | 1 | 0 | 0 | 0 | 0 | (143-0:7) |
| through 1 | S | 1 | 0 | 0 | 1 | 0 | 1 | 1 | 1 | Note: Truncate output to ± 7 if necessary. If A8=1 change sign |
| 1 | S | 1 | 0 | 1 | 1 | 1 | 0 | 0 | 0 | (191-0:7) |
| through 1 | S | 1 | 0 | 1 | 1 | 1 | 1 | 1 | 1 | Note: Truncate output to ± 7 if necessary. If A8=1 change sign |
| 1 | S | 1 | 0 | 1 | 0 | 0 | 0 | 0 | 0 | (159-0:7) |
| through 1 | S | 1 | 0 | 1 | 0 | 0 | 1 | 1 | 1 | Note: Truncate output to ± 7 if necessary. If A8=1 change sign |
| 1 | S | 1 | 1 | 0 | 0 | 1 | 0 | 0 | 0 | (207-0:7) |
| through 1 | S | 1 | 1 | 0 | 1 | 1 | 1 | 1 | 1 | Note: Truncate output to ± 7 if necessary. If A8=1 change sign |
| A9 | A8 | A7 | A6 | A5 | A0 | A4 | A3 | A2 | A1 | DATA |

FIG. -17

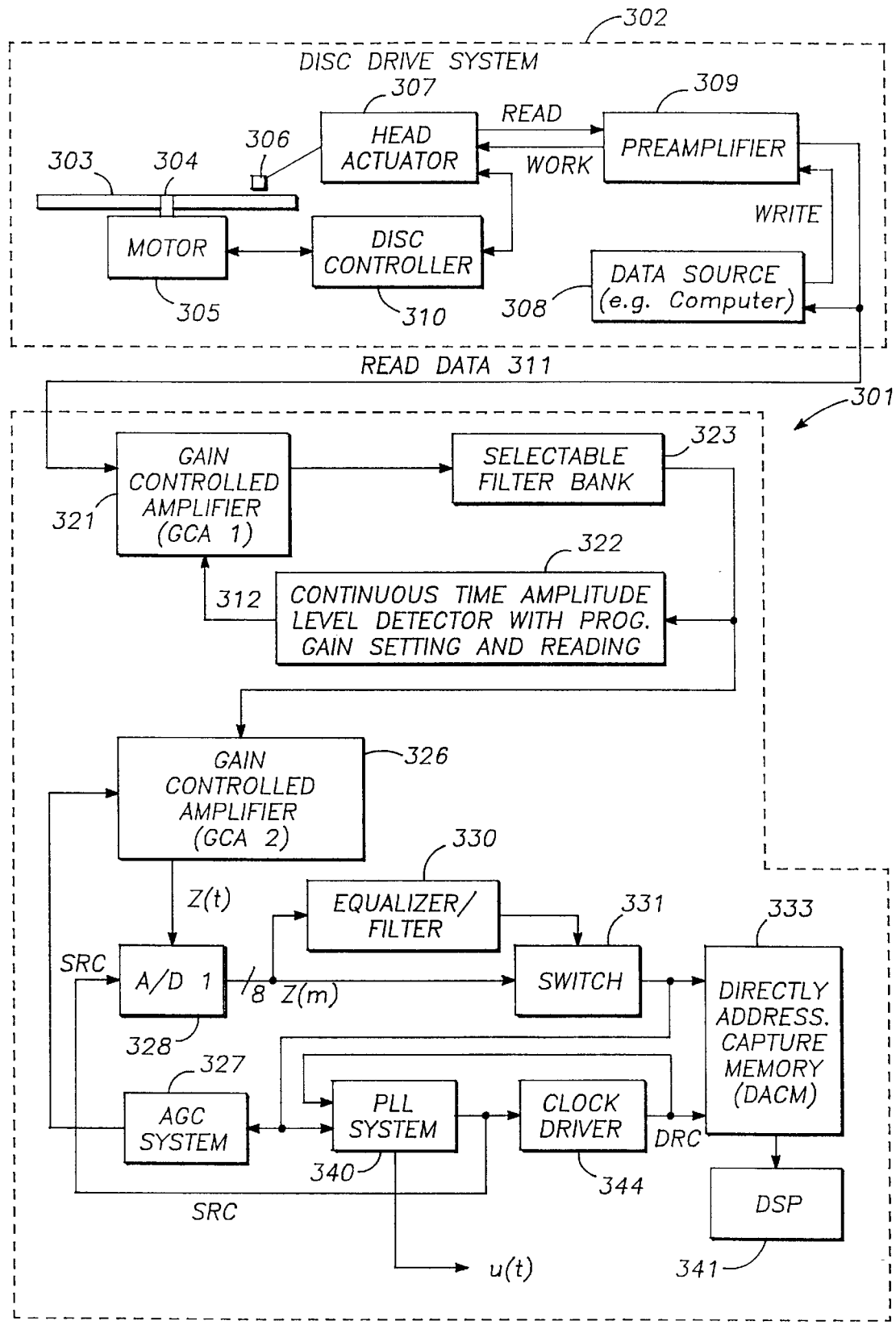
FIG.—18

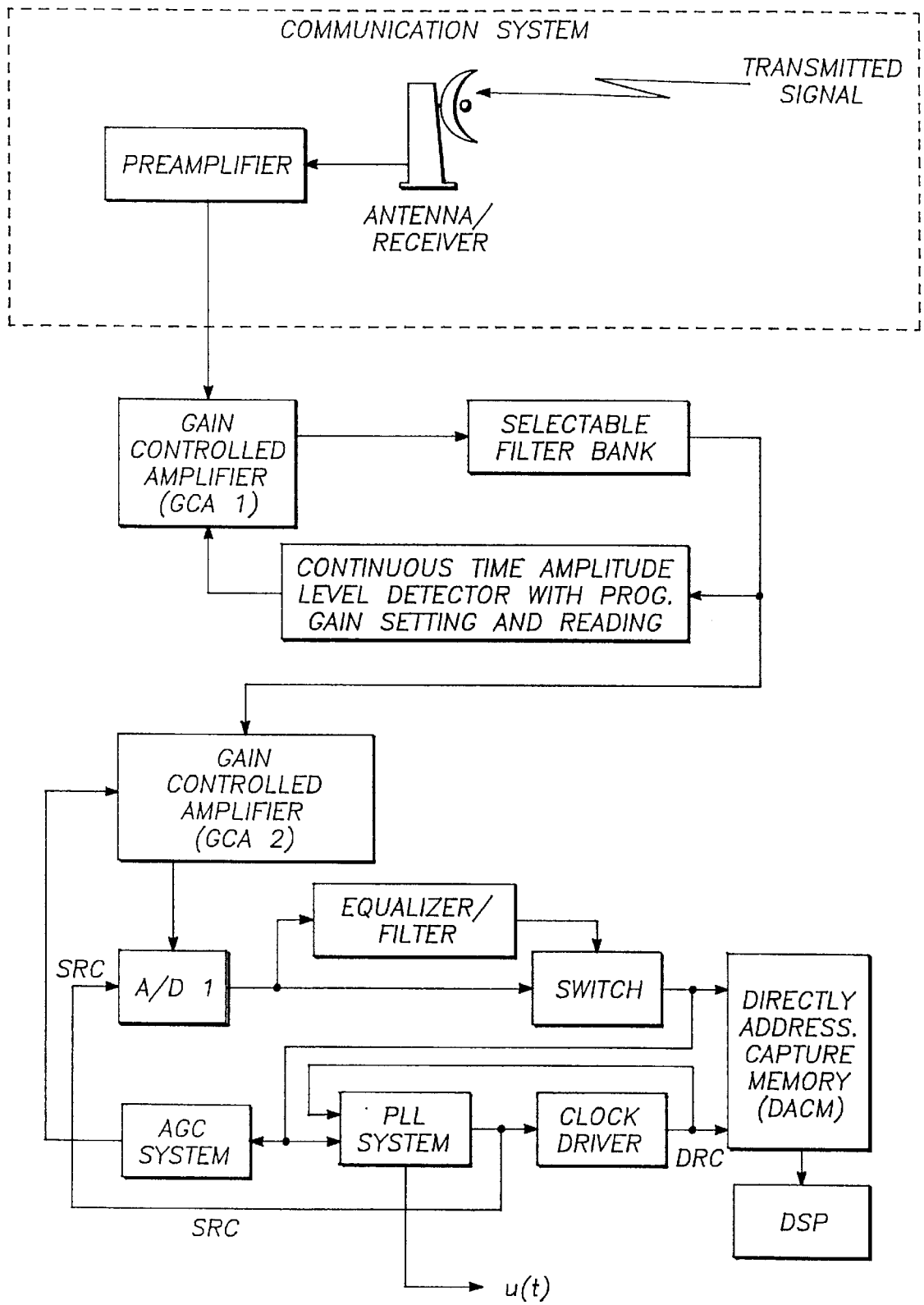
FIG.—19

Write Registers - Equalizer

| Base + 10H | EQL Control Register | |
|---|---|---|
| | D7 = TrigUp | 1 = enable interrupt for Over-Temp sensor |
| | D6 = TrigLo | 1 = enable interrupt for Under-Voltage -5.2V sensor |
| | D5 = L2 | 1 = enable write bank WR15# |
| | D4 = L1 | 1 = enable write bank WR16# - WR23# |
| | D3 = RFLT | 1 = Reset Latched Fault Bits |
| | D2 = Coeff | 1 = Use alternate expression evaluator. |
| | D1 = SelA | 0 = Enable Test/Programming Mode<br>1 = Enable Real-Time Operation mode. |
| | D0 = Hold | 1 = Disable clocks to Tap registers. |
| Base + 11H | Test Clock | Writing any data to this port address causes an Equalizer clock to be generated in Test/Programing Mode (see bit D1 above). The clock uses the same clock distribution circuitry as the Real-Time clock, giving virtually the same results as a real low-speed clock. This clock is used to program the Equalizer as well as testing and debugging. |
| Base + 12H | WR1# | Output port for Memory WR1# |
| Base + 13H | WR2# | Output port for Memory WR2# |
| Base + 14H | WR3# | Output port for Memory WR3# |
| Base + 15H | WR4# | Output port for Memory WR4# |
| Base + 16H | WR5# | Output port for Memory WR5# |
| Base + 17H | WR6# | Output port for Memory WR6# |
| Base + 08H | WR7# | Output port for Memory WR7# |
| Base + 09H | WR8# | Output port for Memory WR8# |
| Base + 0AH | WR9# | Output port for Memory WR9# |
| Base + 0BH | WR10# | Output port for Memory WR10# |
| Base + 0CH | WR11# | Output port for Memory WR11# |
| Base + 0DH | WR12# | Output port for Memory WR12# |
| Base + 0EH | WR13# | Output port for Memory WR13# |
| Base + 0FH | WR14# | Output port for Memory WR14# |
| L1 = High | Bank 1 Enabled | |
| Base + 00H | WR16# | Output port for Memory WR16# |
| Base + 01H | WR17# | Output port for Memory WR17# |
| Base + 02H | WR18# | Output port for Memory WR18# |
| Base + 03H | WR19# | Output port for Memory WR19# |
| Base + 04H | WR20# | Output port for Memory WR20# |
| Base + 05H | WR21# | Output port for Memory WR21# |
| Base + 06H | WR22# | Output port for Memory WR22# |
| Base + 07H | WR23# | Output port for Memory WR23# |
| L2 = High | Bank 2 Enabled | |
| Base + 00H | WR15# | Output port for Memory WR15# |

*FIG. - 25a*

Read Register - Equalizer

| Base + 00H | EQL Status Register | |
|---|---|---|
| | D7 = L2 | Status of L2 enable bit |
| | D6 = L1 | Status of L1 enable bit |
| | D5 = Undvolt# | Status of Under Voltage Sensor (0 = Under Voltage) |
| | D4 = OverTemp# | Status of Over Temperature Sensor (0 = Too Hot !) |
| | D3 = FLT3 | Status of fault bit FLT3 |
| | D2 = FLT2 | Status of fault bit FLT2 |
| | D1 = FLT1 | Status of fault bit FLT1 |
| | D0 = FLT0 | Status of fault bit FLT0 |
| Base + 01H | EQL Data Register | Equalizer Output Register |
| | D7 = MSB | |
| | D6 | |
| | D5 | |
| | D4 | |
| | D3 | |
| | D2 | |
| | D1 | |
| | D0 = LSB | |

*FIG. - 25b*

METHOD AND APPARATUS FOR SAMPLED-DATA PARTIAL-RESPONSE SIGNAL TIMING ERROR DETECTOR HAVING ZERO SELF-NOISE

FIELD OF INVENTION

The invention pertains generally to phase-lock loops, and more particularly to structures and methods for sampled-data timing error detectors for generating timing information to recover partial response signals using a phase-locked loop.

BACKGROUND OF THE INVENTION

Partial-Response Maximum-Likelihood (PRML) technology for recording information on magnetic media is having a revolutionary effect on the magnetic data storage technology. Use of this technology is enabling disk drive manufacturers to dramatically increase the density with which information can be recorded on magnetic media and therefore, significantly increase disk capacity and reduce cost. Similar information density increases are anticipated for magnetic tape recording, and is expected to pertain to optical recording in the future. Conversion of existing test equipment from analog to PRML technology for disk media, transducer read/write heads, and related components will be difficult and likely economically impractical.

The areal density gains achieved in the disk drive industry over the last twenty five years have been primarily the result of evolutionary changes in the head and disk component manufacturing capabilities. These process technology improvements permitted closer head to disk spacing and reduced the noise levels coming from the components. The recording channel, by contrast, has remained virtually the same over the years, speed and accuracy only improving to match the gains achieved in the head/disk area. The only fundamental improvement in the channel occurring during this period was in the area of channel coding (RLL verses MFM, for example) which yielded modest density gains.

In the past few years, however, two new revolutionary technologies have begun to be applied to commercial disk drive products. These are Magneto-resistive (MR) head technology and Sampled Data Channel (for example: Partial-Response Maximum-Likelihood (PRML)) electronics. Both of these technologies are expected to carry the magnetic data storage industry through another decade of steady areal density improvements and concomitant industry growth. Tape drive technology also continues to evolve in order to meet the demand for high-capacity back-up devices. It is likely that PRML technology will significantly affect this technology segment as well.

In disk terminology, the read/write channel refers to the electronics that encodes, reads and writes digital information into the magnetic pulses that are stored on the disk media. Until recently, read/write channels employed conventional Run Length Limited (RLL) encoded Peak Detection technology. However, manufacturers have begun to introduce equipment based on application of a Partial-Response Maximum-Likelihood (PRML) data channel in a rigid disk drive. New high capacity disk drives will likely use PRML technology. It is at least impractical to convert the existing disk media and head test machines from analog to PRML technology, therefore there is a need for new equipment capable of testing and characterizing PRML signal based equipment and components. In particular, test instruments that must be redesigned to accommodate PRML read-write channels include disk media certifiers, functional head testers and head stack testers.

Two different modes of operation are encountered in establishing correct timing: preamble mode and data mode. In the preamble portion, a known data pattern—likely periodic—is recorded. The preamble pattern is chosen to ease the problem of acquiring and tracking the correct timing of the signal. In the data portion, the pattern (data) is deemed to be random; timing has to be recovered solely from the known wave shapes of the pulses, and from the uniform symbol interval T, without any aid from known patterns. Timing recovery from the random-data portion is by far the more difficult part of the problem.

The role of Timing Error Detectors, a type of phase detector, are now described. This invention relates to digital timing error detectors for use with (Extended) Class-4 partial response [(E)PR4] data signals, such as are generated in the playback of modern digital magnetic recording from disk or tape, or other digital-storage device, and also as arise in some data-communications channels. The applicable magnetic recording systems are said to employ PRML (partial-response, maximum likelihood) processing [W&P—R. W. Wood and D. A. Peterson, "Viterbi Detection of Class IV Partial Response on a Magnetic Recording Channel," IEEE Trans. Comm., Vol. COM-34, pp. 454–461, May 1986.]

To see how the inventive timing-error detectors (TED) fit into typical systems, refer to FIGS. 1 and 2, which show block diagrams of portions of typical Read channels for recovery of stored data from data storage devices, such as magnetic or optical storage discs. Analogous diagrams apply to the applicable portions of data receivers in data-communications links.

Input to the channel is a time-continuous (i.e., analog) data signal, played back from a magnetic storage medium, or received in a communications link. The signal consists of a stream of uniformly spaced, identically shaped data pulses, each pulse carrying information on one data symbol in the pulse amplitude.

The analog signal is digitized by sampling it in the sampler and converting the samples into quantized digital numbers in the analog-to-digital converter (ADC). Digital samples are applied to an adaptive equalizer that corrects for distortions of the storage or transmission medium and that makes the waveform conform to a desired standard. Conventional methods for accomplishing these tasks are known to practitioners of the art. Specific apparatus and methods for equalization applicable to embodiments of the instant invention are described hereinafter.

FIG. 1 illustrates a Read channel that uses synchronized sampling; while FIG. 2 illustrates a non-synchronized sampling Read channel. The inventive timing error detectors disclosed herein operate equally well with either kind of sampling. The purpose of the Read channel is to produce strobes, defined as equalized-signal samples, one sample per symbol interval of the input data stream. Correct operation demands precise control of the time instant of each strobe. A strobe-timing adjustment is an essential operation in every Read channel.

With reference to FIG. 1, which shows a schematic diagram of a synchronized sampling channel 100, the phase of the sampling clock signal (timing of sampling instants) is adjusted by a feedback loop 102 such that the samples delivered by the equalizer 104 have the correct timing. That is accomplished by applying the strobes to a timing error detector 106, which measures the timing error in the strobes and feeds that information back through a loop filter 108 to a variable sample clock generator 110 including a voltage-controlled oscillator (VCO) 112 used to generate the sampling clock. Timing error causes the phase of the VCO 112 (the sample timing) to be altered so as to reduce the error. In this manner, the data signal received by sampler 114 is sampled at the appropriate instant. Analog-to-digital convertor (ADC) 116 converts the sampled analog signal to a digital signal which is then coupled to optional equalizer 104. This configuration will be recognized as being analogous to a conventional phaselock loop and the timing error detector 106 will be recognized as a special kind of phase detector. Generic phaselock loops are well known to practitioners.

With reference to FIG. 2 which shows a schematic diagram of a non-synchronized sampling channel, the input signal is sampled with a fixed clock signal generated by fixed oscillator 118, whose uniform timing is unrelated to the symbol timing in the data signal. Strobes with the correct timing are generated by interpolator 120 which interpolates among the non-synchronized samples received from ADC 116 or preferably through optional equalizer 104. Interpolation is adjusted through a feedback loop 122 wherein a timing error detector 106 measures the timing error in the interpolated strobes, passes that information through a loop filter 108 to a controller 124 that provides the interpolator with the information that it requires to interpolate strobes for the correct timing instants. Interpolators and their controllers are described in F. M. Gardner, "Interpolation and Digital Modems, Part I—Fundamentals," IEEE Transactions on Communications, Vol. 41, pp. 501–507, March 1993; and in L. Erup, F. M. Gardner, and R. A. Harris, "Interpolation in Digital Modems, Part II—Implementation," IEEE Transactions on Communications, Vol. 41, pp 998–1008, June 1993.

The same timing error detector principles are used with both kinds of sampling. An interpolator loop typically will be all-digital, whereas a synchronized sampling loop must be an digital/analog hybrid because the VCO is an analog (or hybrid) device. In the former case, the timing error detector 106 is all digital; in the latter case, the timing error detector 106 might be all-digital, or might be a digital/analog hybrid; implementations of both versions are disclosed here. The samplers 114, A/D converters 116, equalizers 104, oscillators 112, 118, loop filters 108, interpolators 120, and controller 124 are shown solely to place the timing error detector 106 in context and may be of conventional design.

In the following description, the notation z(m) refers to the value of the mth strobe in a sequence of strobes applied as input to the timing error detector, and u(m) refers to the value of the mth sample output of the timing error detector. Strobes z(m) are also delivered to decoders (not shown) and other data-recovery operations provided in a complete system. In the inventive apparatus and method, outputs u(m) are produced by timing error detector 106 in response to inputs z(m).

The subject invention applies to detection of timing error on samples of (Extended) Class-4 partial-response data signals—(E)PR4 signals. Characteristics of Class-4 Partial Response Signals defined and the nomenclature used in subsequent description are presented immediately below.

"Partial response" means that adjoining data pulses overlap each other in such manner that the strobe of one symbol instant contains controlled amounts of interference from other symbols. Recovery of an individual symbol value generally requires that information be combined from several strobes. Partial response signaling is employed to make maximum use of a medium or channel that has restricted bandwidth. "Class 4" derives from categorization established by Kretzmer [KRE—E. R. Kretzmer, "Generalization of a Technique for Binary Data Communication," IEEE Trans. Comm. Tech., Vol. COM-14, pp. 67, 68, Feb. 1966.]; distinguishing properties of Class-4 signals are outlined below. "Extended" Class-4 signals make even more efficient use of bandwidth than Kretzmer's original Class-4 signals. Kabal and Pasupathy [K&P—P. Kabal and S. Pasupathy, "Partial Response Signaling," IEEE Trans. Comm., Vol. COM-23, pp. 921–934, Sept. 1975.] provide a thorough explanation of partial response signaling, including Class-4 signals as a special case.

This account deals with processing of binary data streams. Let the mth bit in a data sequence be denoted b(m) and consider the bits to take on values ±A, where A is an arbitrary amplitude. (Comparable results obtain if the bits are assigned. Boolean values 0 and 1.) Bits might be recorded on a storage medium, or they can be transmitted in a communications link.

Due to bandwidth restrictions in the storage or communications channel, and also due to shaping processes deliberately applied, each bit arrives at the channel output as a rounded pulse with waveform represented as g(t). In a "full-response" channel, the value of a bit can be retrieved without interference from any other bits by sampling its received pulse g(t) at one suitable time instant. In a partial-response channel, interference-free sampling is not possible; the best that can be accomplished is to sample the pulses so that only known, controlled interference is incurred from adjoining bits.

Bits are generated at uniform time intervals T. It is useful to regard a received pulse g(t) as consisting of the sum of identically shaped, weighted, uniformly spaced sub-pulses p(t) according to the expression:

$$g(t)=f_0p(t)+f_1p(t-T)+f_2p(t-2T)+\ldots \quad (1)$$

A partial-response pulse therefore is completely defined by the sub-pulse p(t), the weighting coefficients $f_i$, and the value b(m) of its data bit.

Commonly, p(t) is assumed to be the sinc function:

$$p(t) = \frac{\sin(\pi t/T)}{\pi t/T} \quad (2)$$

That is the sub-pulse shape assumed in all subsequent example pulse shapes for purposes of explanation, but is not a necessary feature of the disclosed invention.

Weighting coefficients are conveniently described in a partial-response polynomial expressed as:

$$F(D)=f_0+f_1D+f_2D^2+\ldots \quad (3)$$

where D is the "delay operator" [K&P—P. Kabal and S. Pasupathy, "Partial Response Signaling," IEEE Trans. Comm., Vol. COM-23, pp. 921–934, Sept. 1975.].

The polynomial for all Class-4 partial response signals contains the factor $(1-D^2)$. This factor causes the waveform g(t) to have an s-shape, while the spectrum of the pulse has a null at zero frequency and also at frequency ½T. If p(t) is the sinc function, then the spectrum is null at all frequencies above ½T.

The original Class-4 polynomial (PR4 signals) consists solely of $(1-D^2)$, while extended Class-4 polynomials also have additional factors, as follows:

$$\text{PR4}—(1-D^2)=(1-D)(1+D) \quad (4.1)$$

$$\text{EPR4}—(1-D^2)(1+D)=1+D-D^2-D^3 \quad (4.2)$$

$$\text{E}^2\text{PR4}—(1-D^2)(1+D)^2=1+2D-2D^3-D^4 \quad (4.3)$$

The additional factors of (1+D) or (1+D)$^2$ reduce high-frequency spectral occupancy and permit the signal to better propagate through a band-restricted channel [CIO—J. M. Cioffi et al., "On the Combination of Equalization and Coding in Saturation Recording," Conf. Rec., Intl. Conf. on Comm., ICC'89, Vol. 3, paper 53.8, Boston: June 1989.].

Pulse shapes g(t) are shown in FIG. 3 for each of the above three (E)PR4 signals. An (E)PR4 data signal is composed of a stream of (E)PR4 pulses g(t), uniformly spaced at intervals T; the mth pulse carries the amplitude ±A of the mth bit b(m). The data signal is strobed (sampled) at properly timed intervals T; and data are retrieved from the strobes.

Because of inescapable interference between pulses, each strobe value contains information from two or more data bits. Although the data bits can each take on only two different levels, the combinations of overlapping bits take on more than two levels, depending upon how many bits contribute to each strobe value. The numbers of levels ideally are as follows for each of the (E)PR4 shapes under consideration:

PR4—3 levels

EPR4—5 levels

E$^2$PR4—7 levels.

FIGS. 4–6 show eye diagrams for each of the (E)PR4 shapes PR4, EPR4, and E$^2$PR4 respectively, in which the multiple levels associated with each signal type are evident. It is evident from FIGS. 4–6 that the (E)PR4 signal trajectories in each eye diagram coalesce into the defined ideal levels (different for each signal type) at only one time instant in each symbol interval T. Signal values are highly dispersed at any other instants, such that it is difficult or impossible to retrieve data from dispersed signal values. The purpose of timing error detector 106 is to aid in aligning the strobes to coincide with the instants of ideal signal levels.

Denote the ideal value of the mth strobe as d(m). If the signal shaping and timing are perfect, then d(m) is related to past and present binary data through the partial response polynomials F(D). For the (E)PR4 signals, the relations are:

PR4—$d(m)=b(m)-b(m-2)$ (5.1)

EPR4—$d(m)=b(m)+b(m-1)-b(m-2)-b(m-3)$ (5.2)

E$^2$PR4—$d(m)=b(m)+2b(m-1)-2b(m-3)-b(m-4)$ (5.3)

The value of b(m) is estimated recursively from measurement of d(m) and knowledge of previous estimates of b(m−1) through b(m−4), as applicable. These relations are used in the inventive timing error detectors 106 of the subject invention.

Conventional approaches for implementing Timing Error Detectors, generally classified as either an analog or a digital implementation, are now briefly reviewed. One analog implementation was disclosed by Thomas [THO—J. A. Thomas, "A Simple Method of Clock Extraction from a Correlative Pulse Sequence," Conf. Rec., Intl. Conf. on Comm., ICC'78, Vol. 3, paper 49.3, Toronto: June 1978], and a summary of others is provided by Bingham [BIN—J. A. C. Bingham, "Theory and Practice of Modem Design", New York: Wiley, 1988, Sec. 7.7.]. Only digital methods relate to the present invention so analog methods are not discussed further; all subsequent discussion is of prior digital methods.

All of the conventional methods described below work with just one sample per symbol. Other methods requiring two or more samples per symbol (See, for example, F. M. Gardner, "A BPSK/QPSK Timing-Error Detector for Sampled Receivers," IEEE Trans. Comm., Vol. COM-34, pp. 423–429, May 1986 for an example and further references) are not applicable to timing recovery for (E)PR4 signals.

Maximum Likelihood Methods. Timing can be recovered efficiently from data signals that are free of intersymbol interference (so-called "full-response" signals) by maximum-likelihood (ML) methods, as explained by Franks [FRA—L. E. Franks, "Carrier and Bit Synchronization in Data Communications—A Tutorial Review," IEEE Trans. Comm., Vol. COM-28, pp. 1107–1121, Aug. 1980.]. In the notation of this description, a decision-directed (DD) ML timing error detector works according to the expression:

$$u(m) = \hat{d}(m) \times z'(m) \qquad (6)$$

where z'(t) is the time derivative of the time-continuous waveform z(t) of which z(m) is a sample. That is, z'(m) is a sample of z'(t), taken at the same instant as the sample z(m). In this patent, the caret (^) indicates that indicated value is an estimate of the true value, here that $\hat{d}(m)$ is an estimate of the true value d(m).

The ML timing error detector develops a null output at the peak of the signaling pulse—an ideal location for properly shaped full-response signals. ut the peaks of PR4 and EPR4 signal pulses do not coincide with the ideal sampling points, so the ML method is not applicable to these signal formats. Non-data aided (NDA) ML methods [FRA—L. E. Franks, "Carrier and Bit Synchronization in Data Communications—A Tutorial Review," IEEE Trans. Comm., Vol. COM-28, pp. 1107–1121, Aug. 1980.] based upon $u(m)=z(m)\times z'(m)$ are also known, but these methods fail entirely on heavily band limited signals such as encountered with (E)PR4 waveforms.

Minimum Mean-Square Error (MMSE). Sailer [SLR—H. Sailer, "Timing Recovery in Data Transmission Systems Using Multilevel Partial Response Signaling," Conf. Rec., Intl. Conf. on Comm., ICC'75, Vol. 3, pp. 34–24 to 34–27, San Francisco: June 1975.] and Qureshi [QUR—S. U. H. Qureshi, "Timing Recovery for Equalized Partial Response Systems," IEEE Trans. Comm., Vol. COM-24, pp. 1326–1330, Dec. 1976.] disclose methods for adjusting timing to minimize the mean-square error $e(m)=z(m)-\hat{d}(m)$ at the strobing instants. Their method is based upon the timing-error detector samples $$u(m) = z'(m) \times e(m) \qquad (7)$$

where z'(m) has the same meaning as above. Qureshi shows methods of approximating the derivative for digital implementations.

When noise is present, both z'(m) (or an approximation thereto) and e(m) contain contributions from noise, and so u(m) contains the product of two noise contributions, which is presumably detrimental to performance. In the absence of decision errors, none of the other methods shown here are afflicted by a (noise×noise) product.

Bergmans and Wong-Lam [B&W—J. W. M. Bergmans and H.-W. Wong-Lam, "A Class of Data-Aided Timing-Recovery Schemes," IEEE Trans. Comm., Vol. 43, pp. 1819–1827, Feb/Mar/Apr 1995.] describe a decision-feedback (DFB) variation on the MMSE method, in which the timing error samples are generated according to the equation:

$$u(m) = \hat{z}'(m, \underline{\hat{b}}) \times e(m) \qquad (8)$$

where $\underline{\hat{b}}$ is a vector of estimates of the received binary data symbols (such as $\hat{b}(m), \hat{b}(m-1), \hat{b}(m-2), \ldots, \hat{b}(m-n)$), and $\hat{z}'(m,\hat{b}))$ is a decision-aided reconstruction of the sampled derivative, obtained from the data estimates and from knowledge of the waveform of the (E)PR4 signaling pulse. In the absence of decision errors, the reconstructed $\hat{z}'(m)$ does not contain a noise contribution and so there is no noise×noise contribution to u(m).

Mueller and Müller Methods. A broad class of ad hoc methods using one sample per symbol interval are treated by Mueller and Müller [M&M—K. H. Mueller and M. Muller, "Timing Recovery in Digital Synchronous Data Receivers," IEEE Trans. Comm., Vol. COM-24, pp. 516–530, May 1976.]. Two specific instances are:

Type-A: $u(m)=\hat{d}(m) \times z(m-1) - \hat{d}(m-1) \times z(m)$ (9.1)

Type-B: $u(m)=\hat{d}(m-1) \times e(m)$ (9.2)

Use of M&M Type-A methods are reported in [DSU—F. Dolivo, W. Schott, and G. Ungerbock, "Fast Timing recovery for Partial Response Signaling Systems", Conf. Rec., Intl. Conf. on Comm., ICC'89, vol. 1, paper 18.5, Boston: June 1989.], [CID—R. D. Cideciyan et al., "A PRML System for Digital Magnetic Recording," IEEE J. on Selected Areas in Comm., Vol. 10, pp. 38–56, Jan. 1992.], and [A&C—W. L. Abott and J. M. Cioffi, "Timing Recovery for Adaptive Decision Feedback Equalization of the Magnetic Storage Channel," Conf. Rec., IEEE Global Telecom. Conf., GLOBECOM'90, Paper 901.6, Nov. 1990.]. The last reference, Abott & Cioffi discloses variations and simplifications of the method, and reports that it was used for several different (E)PR4 signal waveforms. Both M&M Types A and B are afflicted by self noise. (See for example, F. M. Gardner, "Self Noise in Synchronizers," IEEE Trans. Comm., Vol. COM-28, pp. 1159–1163, Aug. 1980, for a definition of self-noise.)

Therefore, it is clear that there is a need for a timing error detector that is free of self noise, that is applicable to timing recovery on a random stream of data, that works with only one sample per symbol, and that is robust even for the heavily band limited symbols encountered with (E)PR4 waveforms.

SUMMARY OF THE INVENTION

In one aspect of the invention there is provided structure and method for a signal sampler for sampling a partial response input signal which includes a signal sampling means for sampling the analog input data signal in response to a sample time control signal and generating a sampled analog signal, an analog-to-digital converter for receiving the sampled analog signal and generating a sampled digital signal representation of the sampled analog signal, a timing error detector having an input port receiving the digital signal and generating a timing error control signal u(m) at an output port of the form $u(m)=v(m,\hat{b}) \times e(m)$. Here, $e(m)=z(m)-\hat{d}(m)$, $v(m,\hat{b})$ is a function of the non-return to zero (NRZ) sequence which was originally recorded or otherwise transmitted or communicated, z(m) is the synchronous sampled data value, $\hat{d}(m)$ is the estimated ideal partial response sample value, and e(m) is the timing error estimate. The signal sampler also includes a voltage controlled oscillator (VCO) receiving the timing error control signal and generating the sample time control signal in response thereto. Partial response means that adjoining pulses overlap each other in such manner that the strobe of one symbol timing instant contains amounts of interference from other symbols.

In another aspect of the inventive structure and method, a timing-error detector includes an input port for receiving input data signal z(m) from an external data signal source; first estimator means receiving the input data signal and generating a first output signal representing an estimated value of the multilevel data estimate $\hat{d}(m)$, and generated by normalizing the amplitude of the sampled incoming input data signal z(m) to one of a predetermined number of levels and then rounding or quantizing the normalized signal to the nearest allowable multilevel value to generate the multilevel data estimates $\hat{d}(m)$; second estimator means receiving the first output signal and generating a second output signal representing an estimated value of the binary data $\hat{b}(m)$, and generated estimated recursively from measurement of $\hat{d}(m)$ and knowledge of previous estimates of previous values of $\hat{b}(m)$; phase detector means receiving the input data, the first output signal, and the second output signal, and generating a output error control signal at a control signal output port for use in aligning the sampling strobe timing such that the strobe coincide or nearly coincide with the instants of ideal signal levels; and delay means for aligning the temporal relationships between the input data signal, the first output signal, and the second output signal for input to the phase detector.

In another aspect of the invention, an inventive loop filter and voltage controlled oscillator switching network are provided. In a further embodiment of the invention, structure and method for a signal filter or equalizer are provided. Various embodiments of each of the inventive structures and methods are described, including an embodiment of the invention that supports programmable tracking and acquisition mode algorithms, an embodiment of the invention that provides for selecting which clock signal to use to output data to receiver or a digital signal processor (DSP) system. The DSP may for example comprise components in the inventive test apparatus also disclosed herein. This selection means provides for synchronously over-sampled data which is particularly useful in equipment and/or communication channel test applications.

The inventive apparatus and method advantageously provide capability to perform digital signal processing at the data rate, whereas a software based approach (such as may be implemented for a simulation) cannot be used in a real-time hardware testing environment suitable for data reception over some communication channel, for example over a magnetic disk data read channel under test. The timing error detector also advantageously provides structure and method for estimating the binary data value b(m) based on the non-return to zero (NRZ) sequence, rather than on an amplitude sequence as are some conventional partial response signal detection algorithms.

BRIEF DESCRIPTION OF DRAWINGS

FIG. 1 shows a block diagram of portions of typical Synchronized Sampling READ channel for recovery of stored data from magnetic storage devices and shows how timing-error detectors fit into typical systems.

FIG. 2 shows a block diagram of portions of typical Non-synchronized Sampling READ channel for recovery of stored data from magnetic storage devices and shows how timing-error detectors fit into typical systems.

FIG. 3 shows pulse shapes g(t) for each of the PR4, EPR4, and $E^2$PR4 signals.

FIG. 11 is a diagrammatic illustration showing an embodiment of the inventive timing error detector apparatus.

FIG. 13 is a diagrammatic illustration showing an exemplary data structure for implementing the d-HAT estimator equations in RAM.

FIG. 15 is a diagrammatic illustration showing an exemplary data structure for implementing the B-HAT estimator equations in RAM.

FIG. 16 is a diagrammatic illustration showing an embodiment of the Phase Detector (PD) RAM structure.

FIG. 17 is a diagrammatic illustration showing an exemplary data structure for implementing the Phase Detector equations in RAM.

FIG. 18 is a diagrammatic illustration showing an exemplary embodiment of a test apparatus incorporating the inventive timing error detector coupled to a disc drive.

FIG. 19 is a diagrammatic illustration showing an exemplary signal recovery apparatus coupled to a communication system for recovering signals.

FIG. 25 is a diagrammatic illustration of the Write and Read Control Registers associated with a particular embodiment of an Equalizer/Filter according to the present invention.

DESCRIPTION OF EMBODIMENTS OF THE INVENTION

Inventive Timing Error Detectors for (E)PR4 Signals

Figure 4:
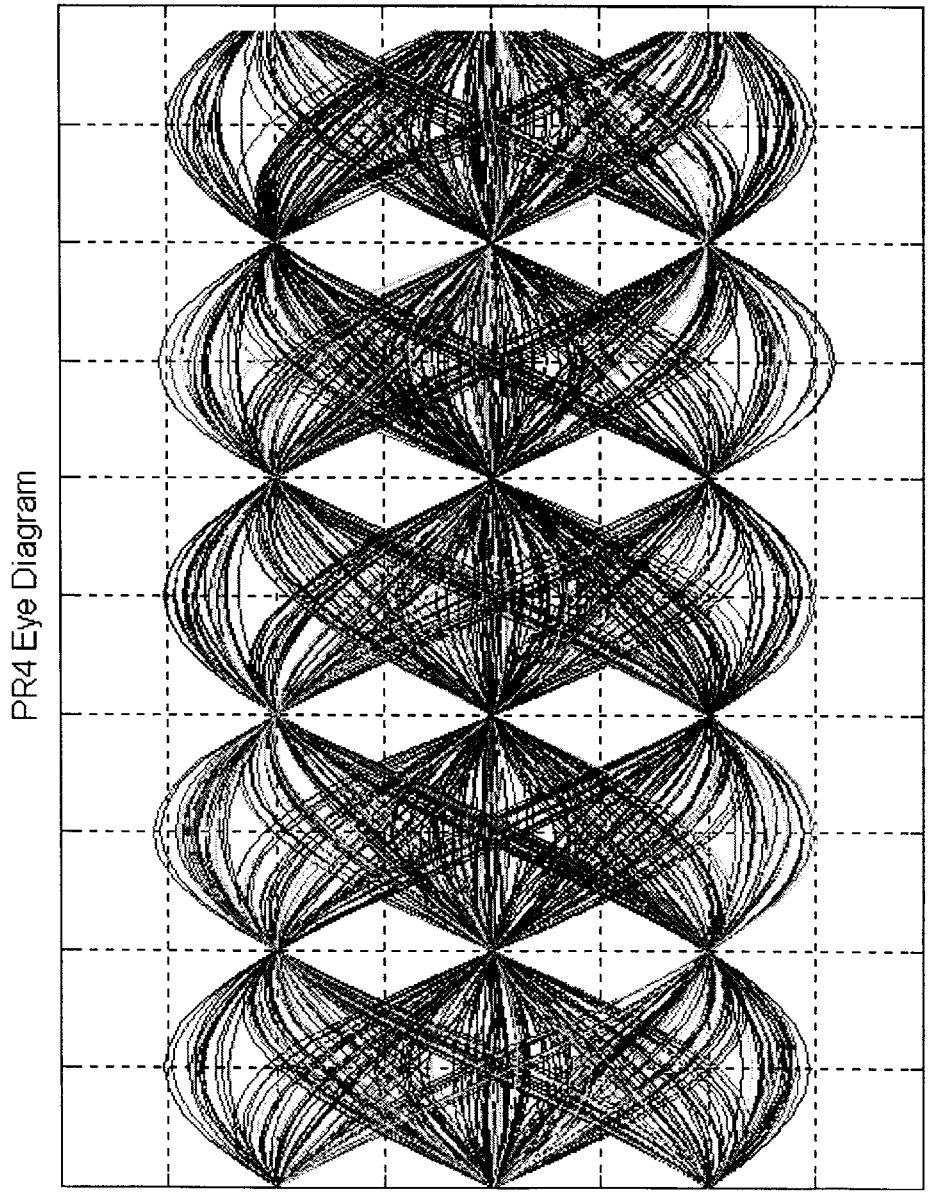
FIG. 4 shows the eye diagram for the PR4 signal shapes, and in particular illustrates which the multiple levels are present for the PR4 signal type.
Figure 5:
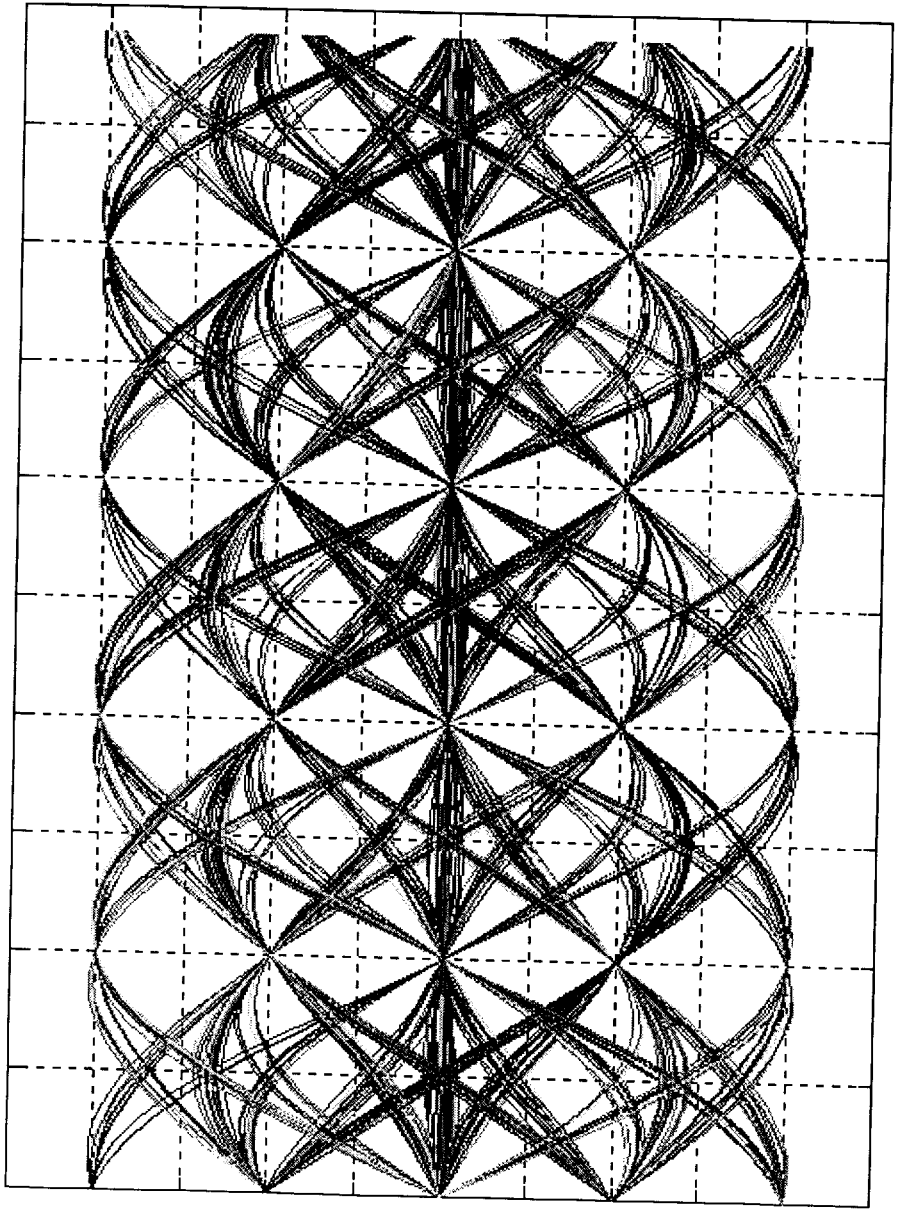
FIG. 5 shows the eye diagram for the EPR4 signal shapes, and in particular illustrates which the multiple levels are present for the EPR4 signal type.
Figure 6:
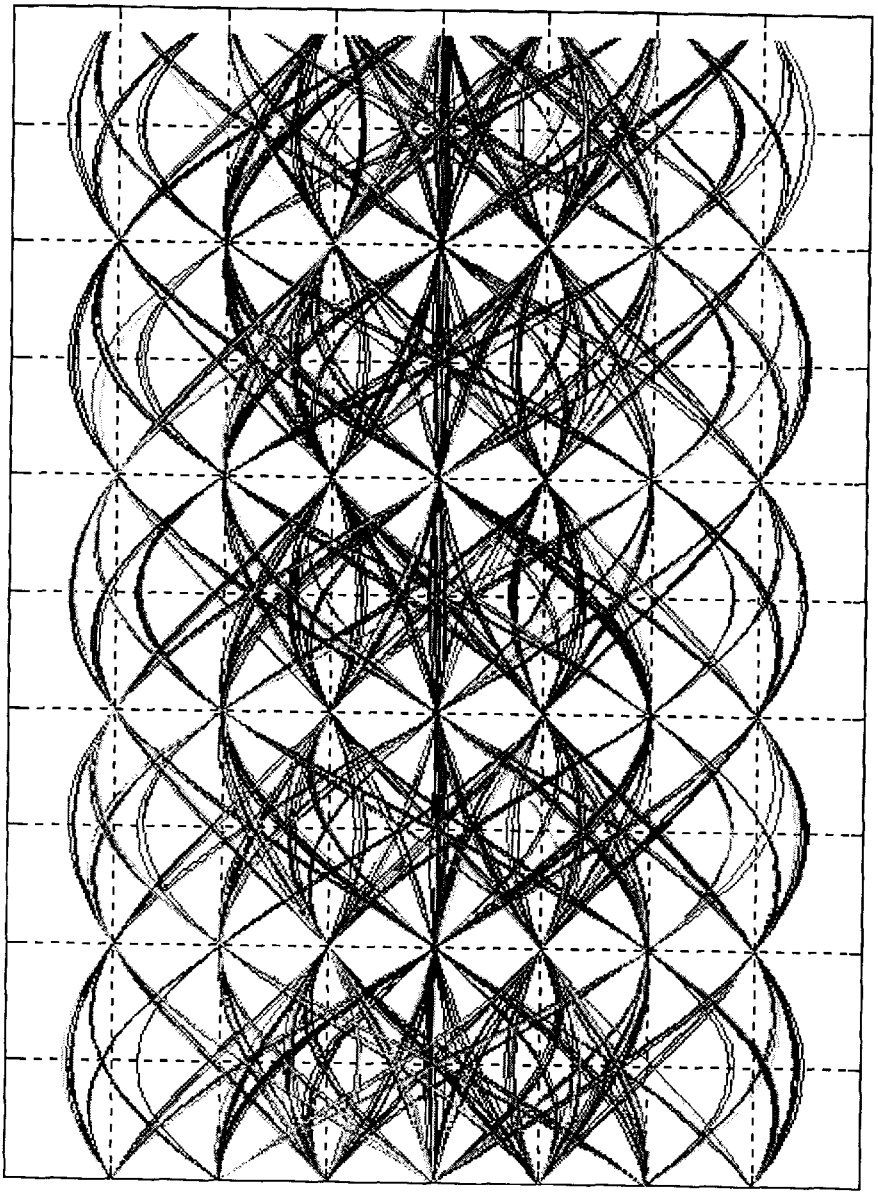
FIG. 6 shows the eye diagram for the $E^2PR4$ signal shapes, and in particular illustrates which the multiple levels are present for the $E^2PR4$ signal type.
Figure 7:
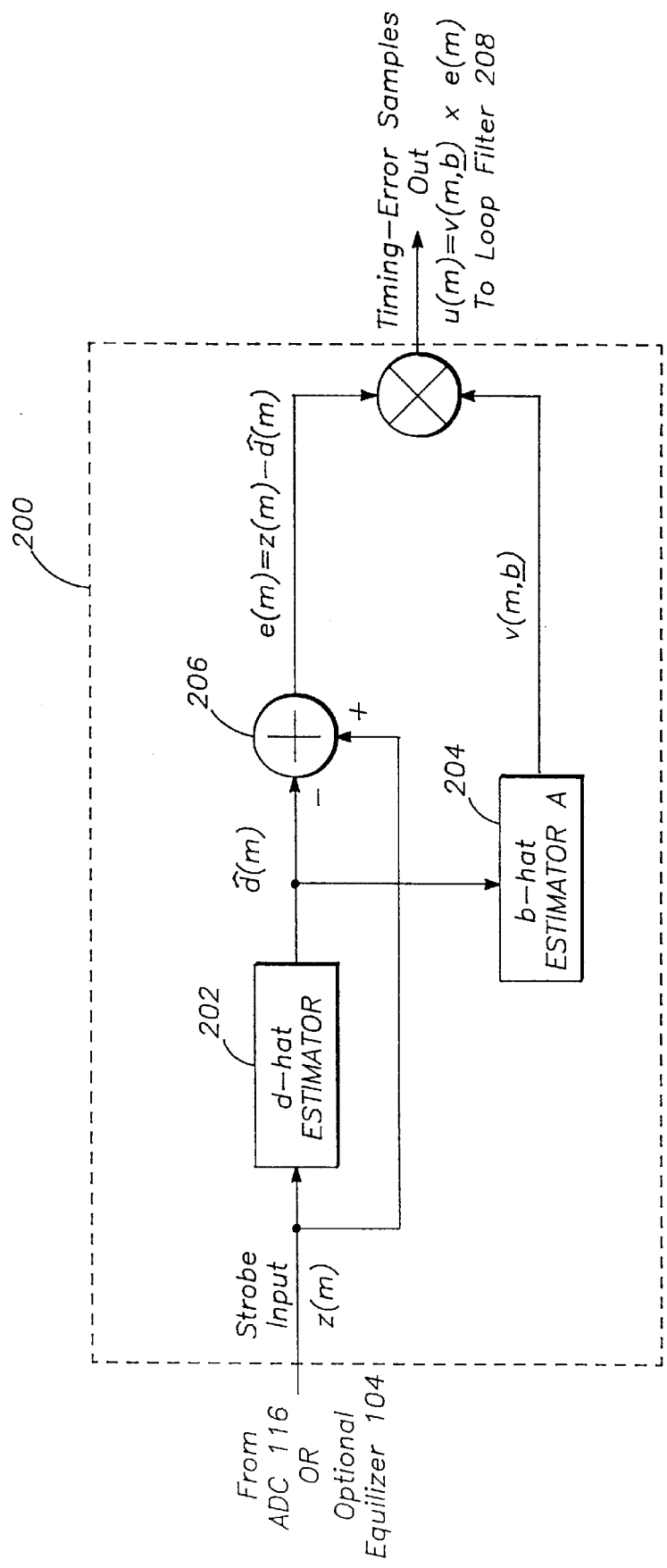
FIG. 7 shows a block diagram of one simple embodiment of the inventive timing error detector.
Figure 8:
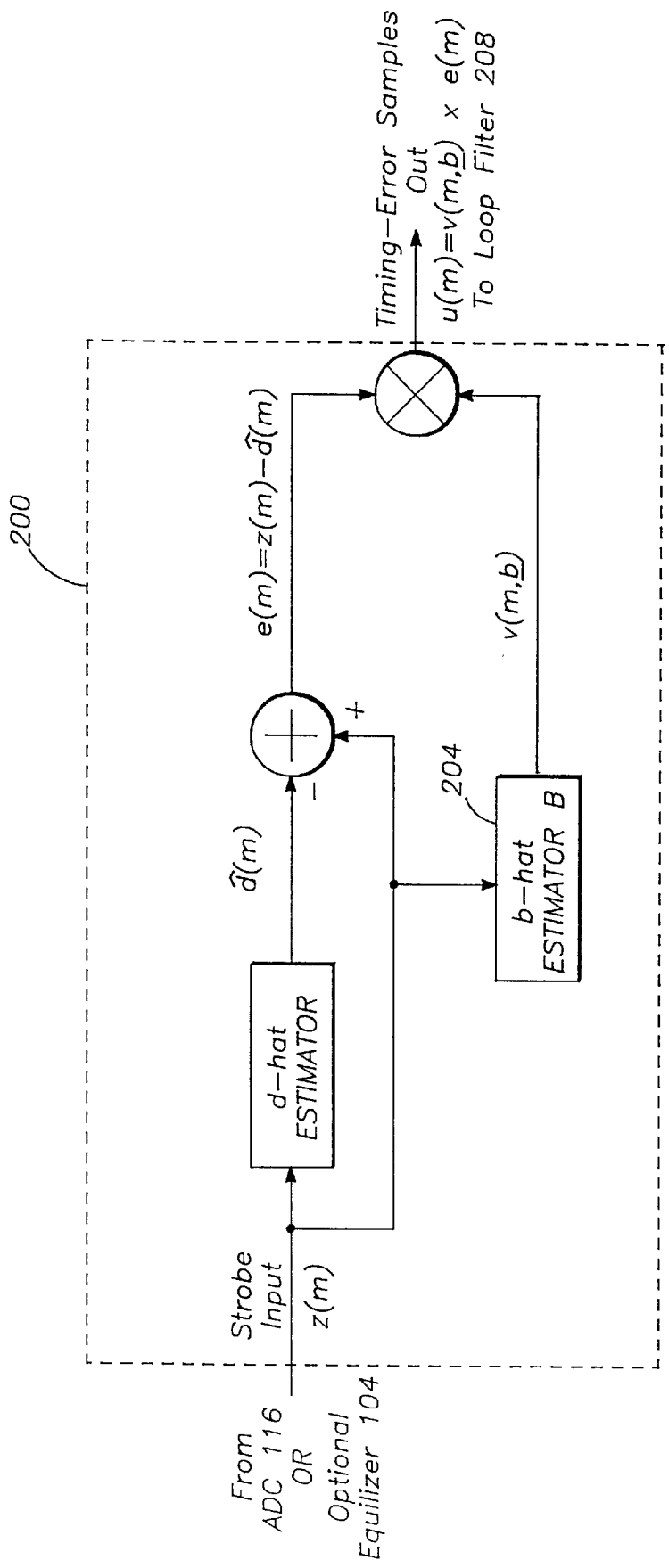
FIG. 8 shows a block diagram of another simple embodiment of the inventive timing error detector.
Figure 9:
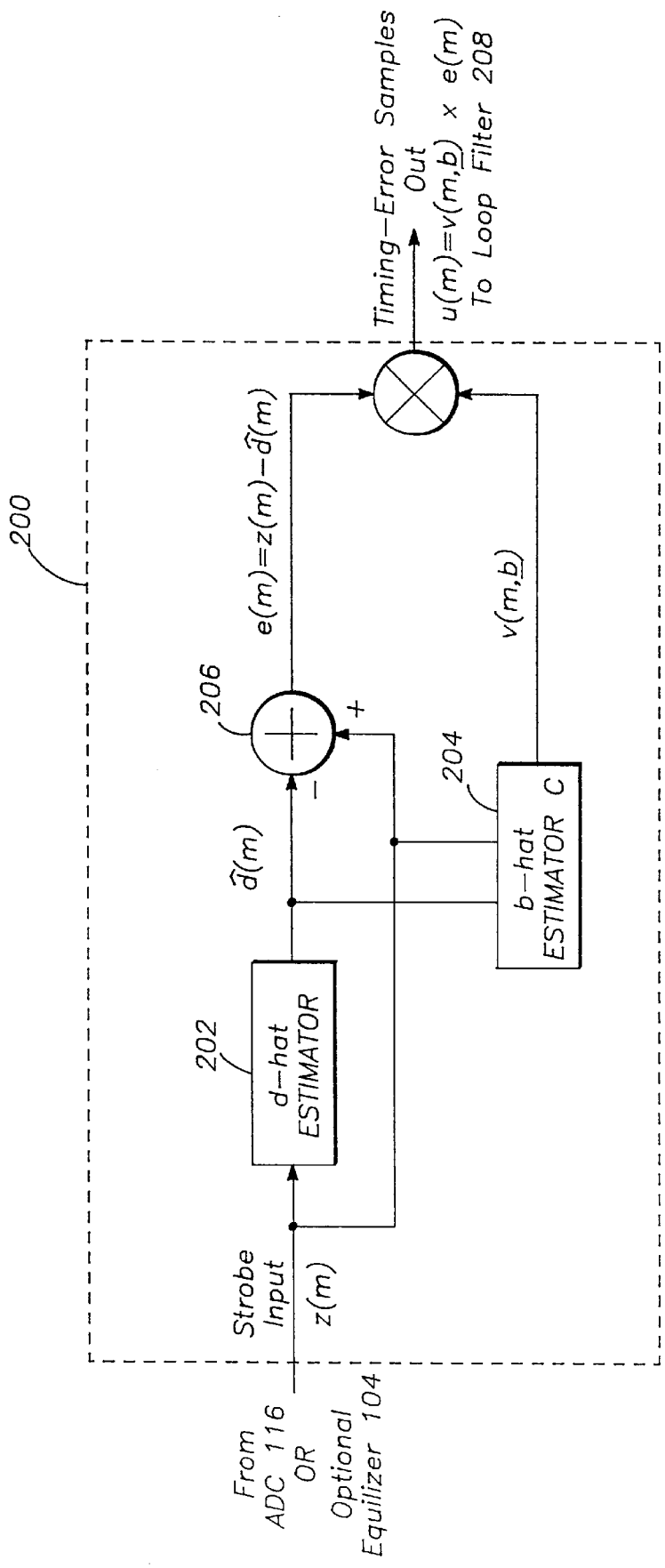
FIG. 9 shows a block diagram of a third simple embodiment of the inventive timing error detector.

FIGS. 7–9 show schematic block diagrams of alternative embodiments of the inventive timing error detector (TED) 200. These TED differ primarily in the manner in which $\hat{b}(m)$ is computed, as described in greater detail hereinafter. It is clearly seen that timing error detector 200 receives strobe signals z(m) as inputs, and generates timing-error samples u(m) as outputs, in the manner that is compatible with the synchronous and non-synchronous channels of FIGS. 1 and 2 already described. Note that references to D-HAT, d-hat, $\hat{d}$, and the like in this descrition are equivalent; in similar manner references to B-HAT, b-hat, $\hat{b}$, and the like are equivalent.

The elements of TED 200 include a d-hat estimator 202, a b-hat estimator 204, a subtractor 206, and a multiplier 208. Input to the detector comprises a sequence of strobe samples z(m) of an (E)PR4 signal (anyone of PR4, EPR4, $E^2PR4$, and the like), one sample per symbol. Output of the timing error detector 200 is comprised of a sequence of timing error samples u(m) which carry information on mistiming of the input strobes z(m).

The inventive method constructs output timing error samples u(m) from the input signal strobe signals z(m), according to the following equations:

$$u(m)=v(m,\hat{\underline{b}})\times e(m), \text{ and} \quad (10)$$

$$e(m)=z(m)-\hat{d}(m). \quad (11)$$

where the notation $\hat{\underline{b}}$ refers to a vector of one or more past values of $\hat{b}$ (m) as defined specifically further below. Multiplying the equations for u(m) by any constant C or the like manipulations does not alter the essential characteristics of the inventive method. Benefits of the inventive method based on these equations includes elimination of self-noise which plagues conventional methods, and existence of a favorable transfer function or s-curve.

Multilevel data estimates $\hat{d}(m)$ are obtained in the d-hat estimator 202 by first normalizing the amplitude of the sampled incoming signal z(m) to a suitable level and then rounding (or "quantizing" or "slicing") the normalized signal to the nearest allowable multilevel data value to generate the multilevel data estimates $\hat{d}(m)$. The different (E)PR4 signals have different allowable data multilevels as follows:

$$\text{PR4—}\hat{d}(m)=0, \pm 2A \quad (12.1)$$

$$\text{EPR4—}\hat{d}(m)=0, \pm 2A, \pm 4A \quad (12.2)$$

$$E^2\text{PR4—}\hat{d}(m)=0, \pm 2A, \pm 4A, \pm 6A \quad (12.3)$$

where ±A represents the normalized levels of the binary symbols b(m). Principles of signal normalization and level slicing are well known to practitioners in the art.

Binary data estimates $\hat{b}$ can be obtained by either of two alternative embodiments of the inventive method. In the first implementation illustrated in FIG. 8, $\hat{b}(m)$ is computed from z(m) and previous $\hat{\underline{b}}$ values according to the following equations for each of the different (E)PR4 signals:

$$\text{PR4—}\hat{b}(m)=sgn[z(m)-\hat{b}(m-2)] \quad (13.1)$$

$$\text{EPR4—}\hat{b}(m)=sgn[z(m)-\hat{b}(m-1)+\hat{b}(m-2)+\hat{b}(m-3)] \quad (13.2)$$

$$E^2\text{PR4—}\hat{b}(m)=sgn[z(m)-2\hat{b}(m-1)+2\hat{b}(m-3)+\hat{b}(m-4)]. \quad (13.3)$$

In the second implementation illustrated in FIG. 7, $\hat{b}(m)$ is computed from $\hat{d}(m)$ and previous $\hat{\underline{b}}$ values according to the following equations for each of the different (E)PR4 signals:

$$\text{PR4—}\hat{b}(m)=\hat{d}(m)-\hat{b}(m-2) \quad (14.1)$$

$$\text{EPR4—}\hat{b}(m)=\hat{d}(m)-\hat{b}(m-1)+\hat{b}(m-2)+\hat{b}(m-3) \quad (14.2)$$

$$E^2\text{PR4—}\hat{b}(m)=\hat{d}(m)-2\hat{b}(m-1)+2\hat{b}(m-3)+\hat{b}(m-4) \quad (14.3)$$

where sgn[x] is defined as +1 for $x \geq 0$ and −1 for $x \leq 0$. These equations are derived from the (E)PR4 polynomials presented earlier, and are equivalent to a method shown by Kabal and Pasupathy [K&P—P. Kabal and S. Pasupathy, "Partial Response Signaling," IEEE Trans. Comm., Vol. COM-23, pp. 921–934, Sept. 1975.].

The two alternative sets of equations may be implemented in corresponding different embodiments of the inventive apparatus. For EPR4 signals, implementation of the equation $\hat{b}(m)=\text{sgn}[z(m)-\hat{b}(m-1)+\hat{b}(m-2)+\hat{b}(m-3)]$ requires only values for $z(m)$ and for $\hat{b}(m-1)$, $\hat{b}(m-2)$, and $\hat{b}(m-3)$. The alternative implementation requires, or may be computed, based on an available value for $\hat{d}(m)$ and the values of $\hat{b}(m-1)$, $\hat{b}(m-2)$, and $\hat{b}(m-3)$. Implementation based on the later set of equations is preferred and is illustrated in FIG. 7. The alternative embodiment based on the former equation is illustrated in FIG. 8. More generally, the implementation illustrated in FIG. 9 provides dual data pathways that support either implementation. Those workers having ordinary skill in the art, in light of this description will appreciate that the same two alternative implementations exist for PR4 and $E^2PR4$ signals and are not further described.

The function $v(m,\underline{\hat{b}})$ is formed for each (E)PR4 signal according to the equations:

$$\text{PR4} \rightarrow v(m,\underline{\hat{b}}) = \hat{b}(m-1) \tag{15.1}$$

$$\text{EPR4} \rightarrow v(m,\underline{\hat{b}}) = \hat{b}(m-1) + \hat{b}(m-2) \tag{15.2}$$

$$E^2\text{PR4} \rightarrow v(m,\underline{\hat{b}}) = \hat{b}(m-2). \tag{15.3}$$

From the above description, it is clear that the timing error information is recovered entirely from the signal strobes $z(m)$, one digital sample per symbol, and that the timing error detector is tailored to its particular signal type, that is either PR4, EPR4, or $E^2PR4$. The timing detector 202 works with random data $b(m)$, consistent with (E)PR4 signaling, and does not require any particular pattern of data. The average output of the error detector is zero at the optimum strobing location of a perfectly equalized (E)PR4 signal. That is, the method is free of bias.

Figure 10:
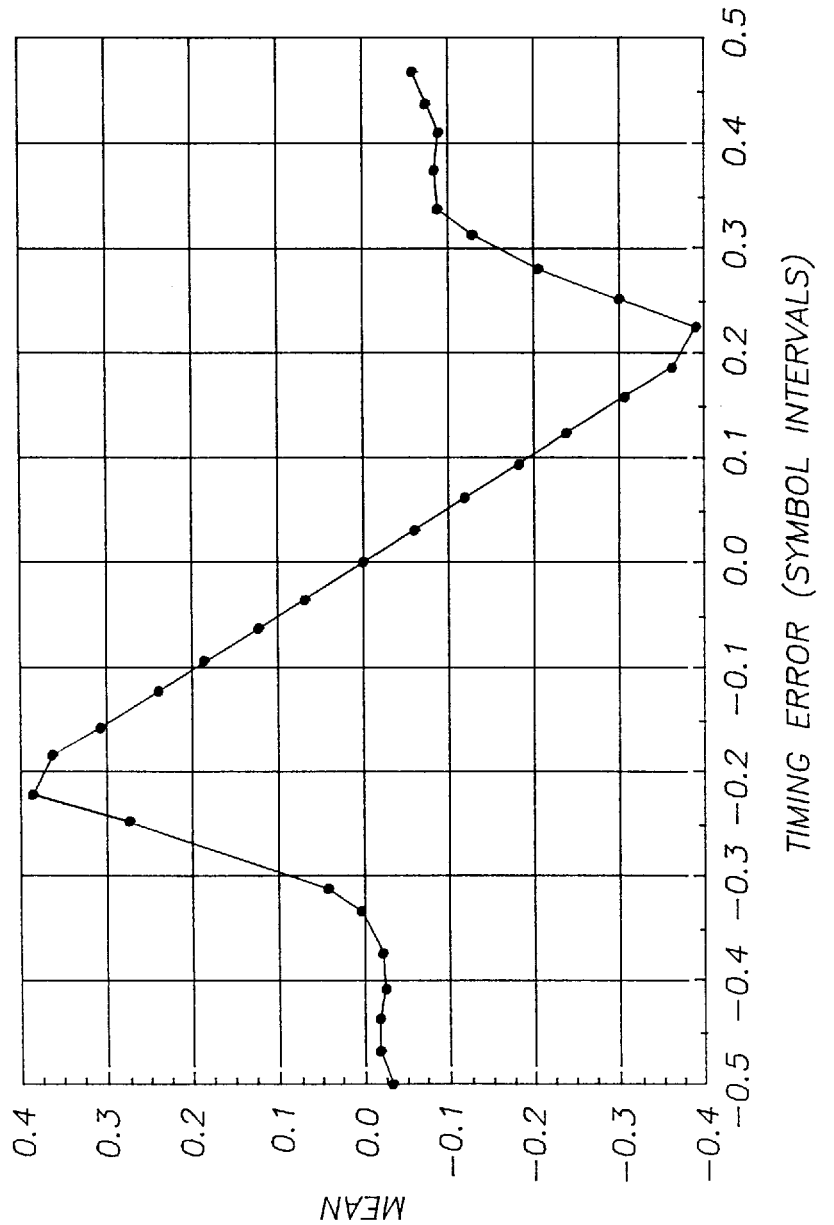
FIG. 10 shows an example s-curve of the mean output of the timing error detector for a PR4 signal, plotted against timing error, and particularly illustrating the slope of the curve at zero-mean value.

FIG. 10 shows an example S-curve of mean output (average value of $u(m)$ measured over many symbols) of the timing error detector 202, plotted against timing error (difference between correct strobe instant and actual strobe instant) for a PR4 signal. The null at zero timing error demonstrates the absence of bias. Peaks of the exemplary S-curve occur near ±0.22 symbol intervals, which is the extent of the horizontal opening of the eye pattern of a PR4 signal. At the timing null, output $u(m)$ is free of self noise [GAR—1—F. M. Gardner, "Self Noise in Synchronizers," IEEE Trans. Comm., Vol. COM-28, pp. 1159–1163, Aug. 1980.]. By comparison, in conventional timing error detectors, self noise often is the dominant disturbance. For EPR4 and $E^2PR4$ signals the S-curve peaks are spaced somewhat closer together because of their narrower eye openings.

The slope of the s-curve at zero timing error establishes the gain of the error detector, a number important for design of the feedback loop. Denote timing error as $\tau$ (tau) and the zero-crossing slope for each of the algorithms is given by the appropriate expression in Table I. Note that the particular value of the slope depends upon the particular implementation of the $\hat{b}$ estimator. The slopes for the different $\hat{b}$ estimators already described with respect to FIGS. 7 and 8 are provided in the following Table I. If the equation for $u(m)$ is multiplied by an arbitrary constant C, then the slope is also multiplied by that same constant C. Once the error-detector gain is known, design of the feedback loop proceeds by well-known methods used for many conventional phase locked loops.

Table I. Summary of slope values for (E)PR4 signals and Alternative Implementations.

TABLE I

Summary of slope values for (E)PR4 signals and Alternative Implementations.

| Signal Type | Slope (see FIG. 7) | Slope (see FIG. 8) | Eq. |
|---|---|---|---|
| PR4 | $-2 A^2 (\tau/T)$ | $-2 A (\tau/T)$ | (16.1) |
| EPR4 | $-1.5 A^2 (\tau/T)$ | $-1.5 A (\tau/T)$ | (16.2) |
| $E^2PR4$ | $-3 A^2 (\tau/T)$ | $-3 A (\tau/T)$ | (16.3) |

Description of the Preferred Embodiment of the Inventive Apparatus for (E)PR4 Signals These inventive steps are readily implemented in the inventive TED apparatus 201. In reference to FIG. 11, an embodiment of the inventive timing detector 201 is now described that supports the above described PR4, $E^2PR4$, and EPR4 type partial response signals. The embodiment in FIG. 11 corresponds generally to the implementation in FIG. 7 already described. In a preferred embodiment of a test apparatus that incorporates the TED 201, other components of apparatus 200 are provided with special features. Those workers having ordinary skill in the art, in conjunction with the description contained herein, will realize that the inventive apparatus, or modifications thereof, will support processing other types of partial response signals.

An Analog-to-Digital (A/D) Converter 202 receives an analog data input signal containing input signal data at an analog signal input port 203, and a sample clock signal at a sample clock input port 204, and a sample clock signal, and generates a digitized data signal at A/D output port 205. In the illustrated embodiment, the A/D converter is shown having an 8-bit output at output port 206, but those persons having ordinary skill in the art in light of this description will realize that other numbers of data bits or channels could be implemented. Other signals in the inventive apparatus are shown relative to the 8-bit data signal, but could similarly be implemented with suitable numbers of bits.

The Sample rate clock signal (hereinafter SRC) is generated by the inventive apparatus as described hereinafter. The SRC is split between the A/D clock input 204 and a clock divider circuit 207 of conventional design. In the illustrated embodiment, clock divider 207 is a programmable divider that divides the input clock by a factor of N where $1 \leq N \leq 64$. The output of clock divider 207 is a data rate clock signal (hereinafter DRC). The DRC is used to clock and synchronize events internal to the inventive apparatus. Clock divider 207 is advantageoulsy incoprorated in to the inventive structure because conventional A/D converters such as employed in one embodiment of the invention perform well with respect to accuracy only over an octave or so of sample rate clock range. The accuracy limitations generally arise in the input sample and hold circuits of the A/D converter. The A/D converter is therefore advantageoulsy run in the upper octave of the SRC and the converted data may be used at the SRC clock rate or some other integer ratio 1/N of that rate. The SRC operates between about 250 MHz and about 500 MHz while the DRC operates between about 2 MHz and about 250 MHz. This alternative channel running at the higher clock rate provides synchronously over-sampled sample data values. Data of this type can be used very advantageously to calculate quantity parameters in a test application, and is particularly advantageous in an inventive test instrument embodiment.

Several sets of serially connected latches are provided in the inventive apparatus 101 for introducing timing delays into the various data paths and for synchronizing data components generated within the apparatus for recombination at a later time. In general, delays of any kind inside a PLL control loop are undesirable because they limit the available control loop bandwidth, and therefore, the speed at which phase acquisition can occur. The various latches and their associated delays are tolerated in the particular embodiment for reasons described hereinafter. However, those with ordinary skill in the art in light of this description will realize that other embodiments and implementations, such as a implementation operating at a lower speed or an embodiment operating with faster devices would not require as many latches.

In the illustrated embodiments, latches are provided in the inventive apparatus for three principle purposes. First, it should be noted that some of the components operate asynchronously relative to either the DRC or the SRC so that latches are required at the respective component's input and output. The input is latched, allowed to propagate through the asynchronous device (e.g. combinatorial logic circuits), and then latched at the output. Latching the input, waiting for propagation to the output, and latching the output result in a propagation delay. (It should be noted that the RAM devices described in this specification are used as infinitely programmable combinatorial logic devices to implement the desired estimation and detection functions, among others.) Second, while some devices (such as A/D converter 202) operate synchronously, concerns about signal propagation time between on-board and off-board components are eliminated by buffering the input with latches. Third, since some of the inventive methods require recombinations of processed versions of the data signals, there is a requirement to implement fixed relative delays between different signal components. Therefore, additional latches are provided to provide further delay so that data signals may be combined in the appropriate manner. Various means may be used for introducing the timing delays other than the simple latches (e.g. D-type flip-flop) shown. For simplicity, such explicit clock inputs are not shown in FIG. 11 so that the data path is more clearly shown. However, clock input signals are indicated by short arrow with either SRC or DRC indicated.

The A/D 202 is clocked by the SRC signal and operates asynchronously relative to the components which receive and utilize the digitized data output. Therefore, an 8-bit latch 208 is provided to latch data at the A/D output port 206 and present the same data at the output port of latch 208 during the next DRC period. The A/D 202 also advantageously provides a separate 8-bit output clocked at the SRC frequency (250≦SRC≦500 MHZ) to read data output selector block 225, described in greater detail hereinafter. This alternate channel is advantageously provided in the illustrated embodiment which is fabricated from some off the shelf components, because the off-the-shelf components may not be operable at sufficiently high speed to provide a 500 MHZ signal through the TED and the ability to query and observe read data at the higher rate is advantageous in a test instrument. Those having ordinary skill in the art in light of this description will appreciate that the TED 201 can be operated at higher clock frequencies than the 500 Mhz clock speed specifically described relative to the particular embodiment when the implementation is supported by custom chip sets and/or custom printed circuit board design, which techniques are well known in the art.

Equalizer also operates asynchronously relative to the DRC and SRC, so that latches are needed on its input and output. The 8-bit data signal from latch 208 is fed to latch 213 and then into the (optional) Equalizer and Multiplexor Circuit (EQ/MUX) 210. EQ/MUX 210 includes two components, an Equalizer/Filter circuit 219 and a selector/multiplexor circuit 221. Equalizer 219 receives the 8-bit data signal from latch 213 and filters/equalizes the received data so that both the output read data 230 and the data input to the $\hat{d}$-estimator 232 and $\hat{b}$-estimator 234 most nearly approximates the ideal (E)PR4 signal characteristics after passing through the communication/read channel.

In the illustrated embodiment, the A/D converter 202 (obtainable as a commercial product) orates synchronously but in particular embodiments is located on a printed circuit board separate from other components of the timing error detector. Providing A/D converter 202 in this manner is desirable for two reasons. First, separation provides the necessary printed circuit board area due to form factor limitations associated with compliance with the standard VXI Bus used to implement the instrumentation. Secondly, the implementation allowed separation of the bulk of the analog signal processing functions from the digital signal processing functions, thereby providing optimum electrical noise performance. Other implementations wherein the A/D converter operates synchronously and is co-located with the digital signal processing circuitry may be implemented without the latches.

Latch 208 is used to receive the A/D converter output from the second printed circuit board. The output of latch 208 is fed to latch 213 and also provides a separate user read data path for over sampled and unequalized read data cases. These signal paths are long enough to cause propagation delays which may be significant relative to the maximum clock cycle time (about 4 nanoseconds at 250 Mhz). Latch 213 is provided for an analogous reason in that the Equalizer/Filter function provided by Equalizer 214 is implemented as a synchronous function on a third printed circuit board and latch 213 is used to ensure reliable timing in the transmission of the read data. To the extent that the A/D converter 202 and the Equalizer 214 were implemented on the same board as the other timing error detector components, or that signal propagation times were otherwise controlled, latches 208 and 213 would be unnecessary.

The capability to equalize the data signal is provided in conformance with conventional digital signal processing techniques. For example, in one embodiment of the invention a 13-tap Finite-Impulse-Response (FIR) type filter is implemented. The 13-tap FIR filter introduces an additional (13/2=7.5) 8-clock cycle delay (D=8) in the data stream. The equalized data signal and an unequalized data signal generated by bypassing the Equalizer are fed to a selector or multiplexor (MUX) 221 and one of either the equalized or unequalized versions of the data signal is selected and output from MUX 221 in response to a select equalized or unequalized control signal 222 generated from an external control signal generator 223.

The provision of the equalization and selection circuity provides the user with the capability to use the equalization provided by asserting the select equalized signal control signal 222, or to bypass the equalization by asserting the select unequalized signal control signal. For example, the equalization or filtering may be provided externally so that no additional equalization is needed. The output of the multiplexor 221 is fed to a third latch 226 which receives the asynchronously generated signal and holds it for output during the next clock period. Each of the latches 208, 213, 226 introduces a one-DRC cycle delay in the output relative to the input data.

Read data 230 in digital form, which is the data the user is interested in, is presented at the output port of the third latch 226. The read data 230 is also fed to a $\hat{d}$ (D-HAT) value estimator circuit, such as that illustrated in FIG. 12, that computes the estimated value of the recorded data and referred to as $\hat{d}$ estimator 232. The read data 230 is also advantageoulsy fed to read data output selector block 225 which also receives the optionally provided 8-bit output clocked at the SRC frequency (about $250 \leq SRC \leq 500$ MHZ), and a read data output selector control signal (RDSC). The read data output selector control signal (RDSC) identifies the desired instrument output signal from among the equalized data at the DRC rate (about $2 \leq DRC \leq 250$ MHZ), the unequalized data at the DRC rate, or the over-sampled data at the SRC rate.

When the partial response signals (E)PR4 are PR4-type signals the $\hat{d}$ estimator is a ternary estimator that estimates which of (0, ±2A) the received data corresponds to. For EPR4 signals the estimator is a quinary estimator that estimates which of (0, ±2A, ±4A) the received data corresponds to, and for E2PR4 signals the estimator is a septenary estimator that estimates which of (0, ±2A, ±4A, ±6A) the received data corresponds to. Here "A" represents the normalized levels of the binary symbols b(m).

Figure 12:
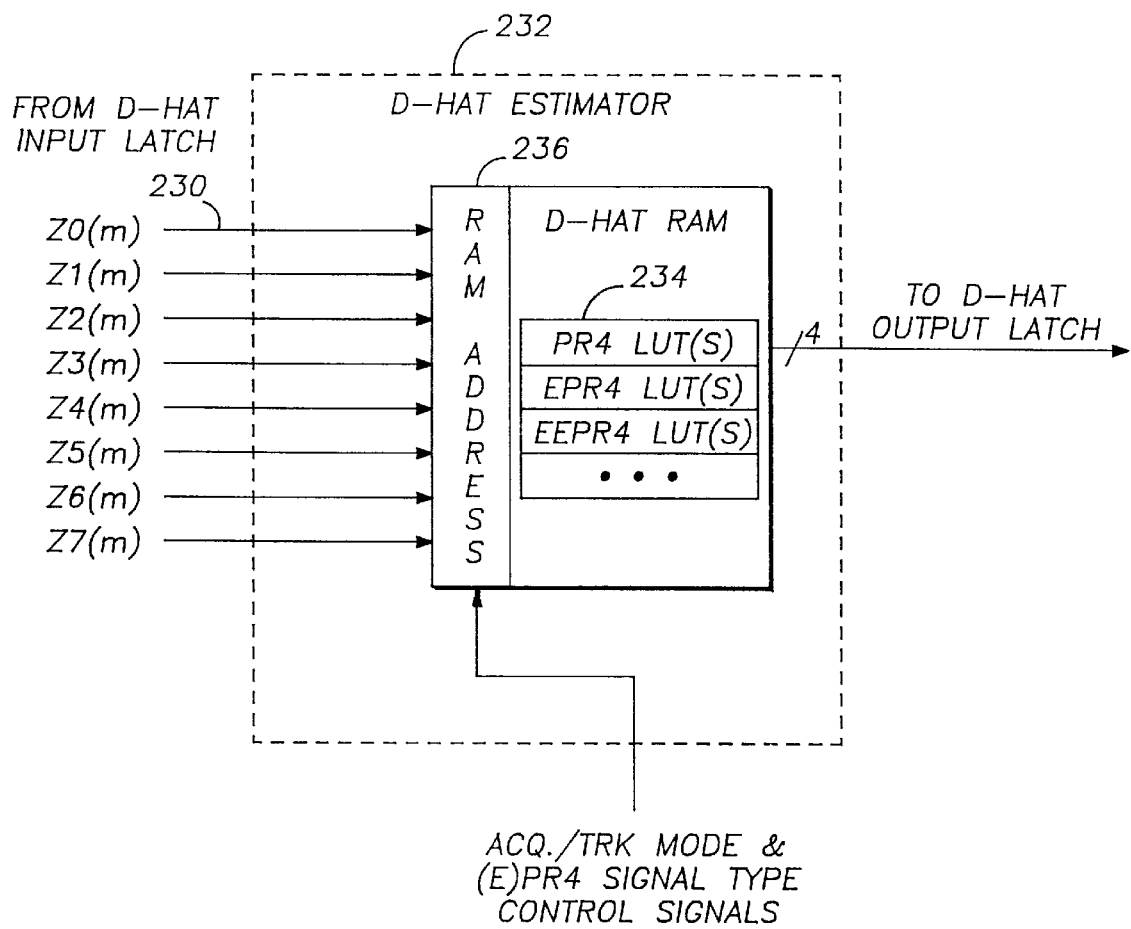
FIG. 12 is a diagrammatic illustration showing an embodiment of the D-HAT estimator.

With reference to FIG. 12, the D-HAT estimator 232 functionally includes a RAM Addressing block 236 that receives a plurality of input data $z_0(m), \ldots, z_7(m)$ as inputs, and which correspond in some predetermined manner to values stored in Look-Up Table (LUT) 234 within a D-HAT RAM 233. The LUT generates or otherwise provides a 4-bit output to the D-HAT output latch in response to each input. Control signals that identify whether the apparatus is operating in an acquisition or tracking mode, and the type of (E)PR4 signal being received are also provided as inputs to the RAM addressing block.

The inventive structure can selectively operate in either of two modes: (1) an acquisition mode, and (2) a tracking mode, and includes a phase/frequency detector component and a timing error detector component. The phase/frequency PLL is generically similar to conventional design; however, its novel inclusion of a digital-to-analog converter (DAC) permits detected values to be read-out so that performance can be monitored. This DAC based read-out capability is important in a testing environment. The conventional phase/frequency PLL component provides a close approximation to the target frequency but does not provide a phase estimate. The phase estimate is provided by the timing error detector.

In the preferred embodiment, the $\hat{d}$ estimator includes a fast random access memory RAM that stores a look-up or state table 234 data structure which is accessed in response to the output of RAM address circuit 236. In the preferred embodiment of the invention, each RAM is advantageously of an emitter-coupled logic (ECL) design so that high speed is achievable. Furthermore, each ECL RAM has a read/write capability via an associated RAM controller (not shown) of conventional design for controlling read/write, addressing, and other RAM associated control functions. The ability to address and write and read data to the RAMs does not (materially) affect the propagation delay through the path defined by latch 241, block 232, and latch 242. An address multiplexer is used to select the normal data path or the programing path to accomplish the addressing and read/write operations. Read capability via the RAM controller is advantageously included in the embodiment to provide a self-test capability.

The RAM address is determined by the 8-bit inputs $z_0(m)$, $z_1(m), z_2(m), \ldots, z_7(m)$ from the read data 230. For each 8-bit input 230, a corresponding output 240 is generated. A $\hat{d}$-RAM control bit is may also optionally be provided as an input to the $\hat{d}$-RAM address input port so that different equations may be implemented for acquisition mode and tracking mode. The procedure for generating the $\hat{d}$ value is described in greater detail hereinafter.

An exemplary data and logic structure for the D-HAT RAM is now described with reference to FIG. 13, which shows the definitions for the data output corresponding to a range of address inputs which implement the RAM computational equations for a $E^2PR4$ signal as implemented in the D-HAT RAM. The data output value (0, 1, 2, 3, 4, 5, or 6) corresponding to the particular range of addresses, each address defined by set of input (address) bits: $A_0, A_1, A_2, \ldots, A_9$. The Table in FIG. 13, defines the address and output data definition for loading the RAM. For example, the first two rows (0X00000000 through 0X00111111) are meant to specify that the RAM addresses 0X00000000 through 0x00111111 contain the RAM output data of value "0." The remainder of the entries in FIG. 13 specify the contents of all possible 2046 address location in the exemplary D-HAT RAM. The bits $A_0, A_1, A_2, \ldots, A_7$ (notated $A_{7:0}$) are generated by A/D converter 202; bit $A_8$ is a "don't care" and may take on either "0" or "1" without effecting the output, and $A_9$ is a mode control selector bit wherein a "0" signifies that the system is using the acquisition mode parameters and a "1" indicates that the system is using the tracking mode parameters. The D-HAT RAM output is the estimated ideal sample value encoded in a 4-bit nibble. The parameters define the functional relationship between input and output and the implementation comprises an infinitely programmable logic function. The parameters (function) may be the same for each of the tracking and acquisition mode but will generally be different as illustrated. The D-HAT RAM does not look at particular sequences of input bits, but rather outputs and ideal sample value decision based solely on the current read data sample value input. For example, a current read data sample input z(m) in the range between "00000000" through "00111111" during acquisition mode results in an output of "0", whereas a current read data sample input z(m) in the range between "00000000" and "00101111" result in a "0" during tracking mode.

The RAM based implementation of the D-HAT, B-HAT, and Phase Detection algorithms is advantageous for several reasons. First, different equations or parameters within equations are easily implemented by changing the the look-up table (LUT) for PR4, EPR4, and $E^2PR4$ signals, for different communication channels, and for tracking mode or acquisition mode. The change in LUT values may be implemented either by including alternative addresses for the different schemes, by loading new values for particular testing environments, or by switching between different RAM. Read Only Memories (ROMs) may be used in place of the RAM memory but is not preferred.

Those workers having ordinary skill in the art, in light of this description, will realize that the invention is not limited to the particular equations implemented within the exemplary RAM data structure. They will also appreciate the manner in which analogous equations that define a D-HAT estimator output in terms of particular D-HAT RAM inputs may be defined for PR4 and EPR4 signal types based on the equations for $\hat{d}$ already presented.

Because this implementation of the $\hat{d}$ estimator circuity operates asynchronously, latch 241 is provided at the input of the D-HAT RAM 233 to latch its input, and latch 242 is provided at the output of the D-HAT estimator 232 and provides the $\hat{d}$ output. Latches 241 and 242 are of conventional design.

As already suggested in the discussion relative to FIGS. 7 (and 11), 8 and 9, the d̂ value is conveniently used to compute the d value as well. The implementation in FIGS. 7 and 11 have the advantage that the number of bits propagating through the system is reduced. One particular advantage of the embodiment illustrated in FIGS. 7 and 11 is that fewer address lines are necessary, and consequently a smaller RAM may be used. This situation is particularly advantageous for high speed implementations, as large ECL RAMs, such as ECL RAMs having more than about 10-bit address inputs for example, are not readily available as standard components from commercial sources. One minor disadvantage of the implementation in FIG. 7 as compared to the implementation in FIG. 8 is that the FIG. 7 implementation requires two additional clock delays. Each of the embodiments may provide particular advantages for particular applications. The least significant bits of the 8-bit d̂ value are fed to latch 251 of b̂ computational circuit 234. A B-HAT estimator 234 receives these four least significant d̂ bits as well as recursively receiving or using the current and the five earlier b̂ RAM outputs. The generation of these b̂ RAM outputs is now described. The particular b̂ estimates used depends on the type of (E)PR4 signals and is generated based on the appropriate algorithm for PR4, EPR4, and $E^2PR4$ signals. As will be explained in more detail, the inventive structure advantageously supports all of the (E)PR4 signal types with modification of the contents of the D-HAT RAM 233 and the B-HAT RAM 261.

Figure 14:
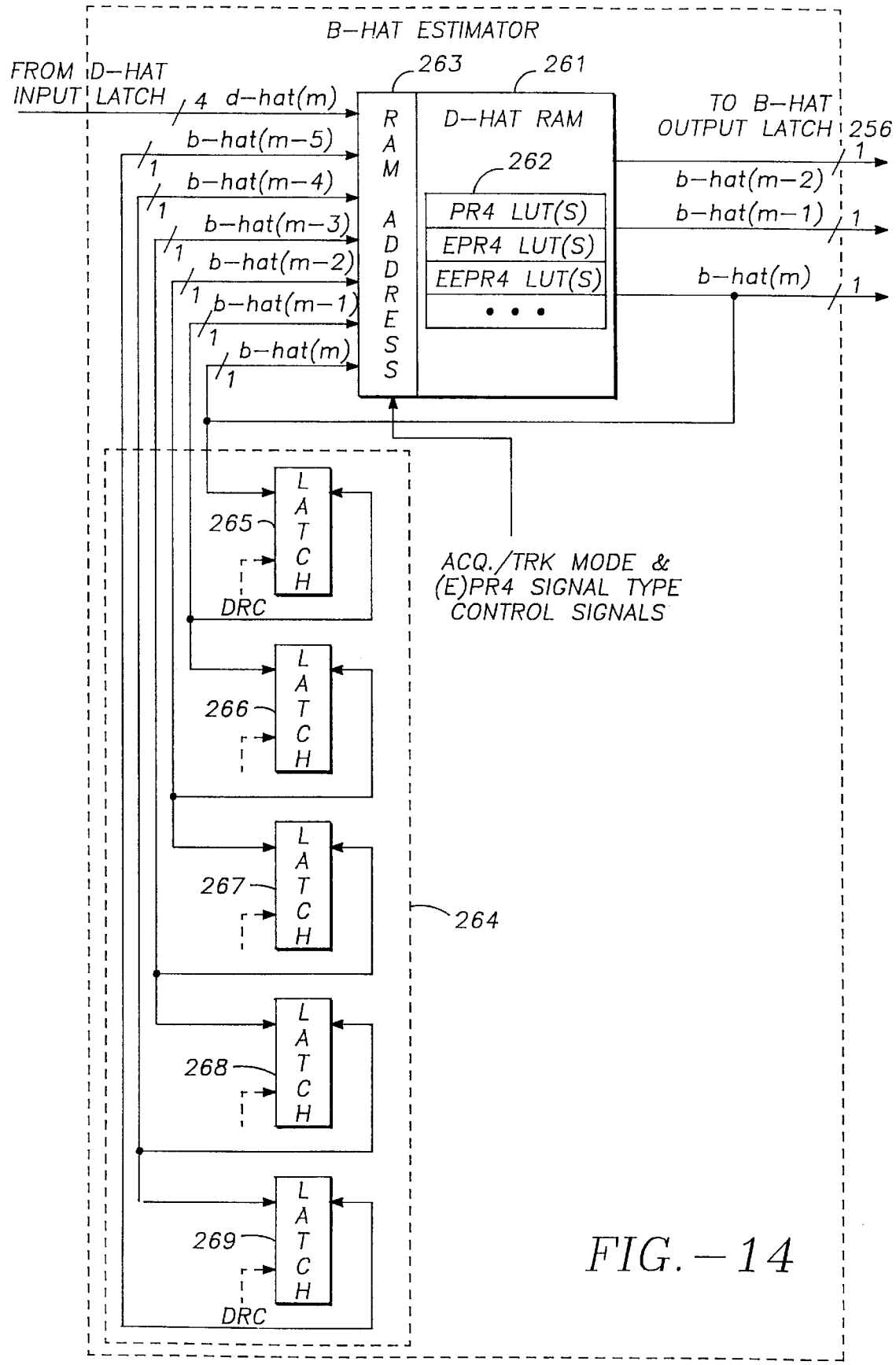
FIG. 14 is a diagrammatic illustration showing an embodiment of the B-HAT estimator.

With reference to FIG. 14 which shows an exemplary implementation of a B-HAT estimator 234, comprising a B-HAT RAM 261 including a look-up table (LUT) 262 and a RAM address circuit 263; and a digital delay line 264 comprising five latches 265, 266, 267, 268, and 269. The b̂-RAM outputs a first on-bit word containing the current b̂(m) value, and a second two-bit word containing the b̂(m−1) and b̂(m−2) values. Both of the b̂(m−1) and b̂(m−2) values are not required for all (E)PR4 signal types. Any of the b̂(m−x) values, where x is an integer, could be output as the two (or more)-bit output sent to the Phase Detector RAM 281. In general the B-HAT RAM 261 and the B-HAT Estimator may be implemented to provide outputs for each of b̂(m), b̂(m−1), . . . , and b̂(m−n) where n is an integer representing an n-th delayed version of b̂(m). This feature is advantageous in the inventive apparatus and method because it enable the use of the circuit for other partial response coding schemes, that is partial response coding schemes other than PR4, EPR4, and $E^2PR4$ that may require different or additional b̂(m−n) terms. It should be noted that the estimated value of B-HAT is based on the non-return to zero (NRZ) sequence, rather than on an amplitude sequence as are some conventional partial response signal detection algorithms. According to the present inventive structure and method, the NRZ sequence is used to generate the amplitude sequence.

Furthermore, the number of stages requested in delay line 264 will generally depend on the partial response signal type. For PR4 signal, the b(m−2) is needed, for EPR4 the b̂(m−1), b̂(m−2), and b̂(m−3) are needed, and for $E^2PR4$ the b̂(m−1), b̂(m−3), and b(m−4) are needed. Therefore, five stages are provided to support the deflect signal types. Delayed versions of the b̂ signals not needed for a particular computation are simply ignored and represent "don't care" in the D-HAT RAM data structure.

Digital delay line 264 is implemented by: (1) connecting the first one-bit output of the b̂-RAM 261, that is b̂(m), to the input of latch 265 and back to an input port of the b̂-RAM address input block 263; (2) connecting the output of latch 265, that is b̂(m−1), to the input of latch 265 and back to an input of the b̂ RAM; (3) connecting the output of latch 266, that is b̂(m−2), to the input of latch 267 and back to an input of the b̂ RAM; (4) connecting the output of latch 267, that is b̂(m−3), to the input of latch 268 and back to an input of the b̂-RAM; (5) connecting the output of latch 268, that is b̂(m−4), to the input of latch 269 back to an input of the b̂-RAM; and (6) connecting the output of latch 269, that is b̂(m−5), back to an input of the b̂ RAM thereby forming a delay line from a linear cascade of five latches. In this manner the b̂ RAM receives a 4-bit d̂ value corresponding to z(m), and the series of up to five b̂-values selected from the set b̂(m), b̂(m−1), b̂ m−2), b̂(m−3), b̂(m−4), and b̂(m−5). Some implementations of the invention for particular ones of the (E)PR4 signal types may not require or make use of all the values b̂ and could be implemented by a delay line having fewer cascaded stages, but provision of each of the stages advantageously permits operation of the apparatus for all signal types without any detrimental impact. Similarly, the number of latches in the delay line 264 may be advantageously increased so that algorithms developed in the future are supportable by the hardware.

It should be noted that for the PR4 and $E^2PR4$ type signals, a one-bit b̂ output signal is sufficient, whereas for EPR4 type signals, both bits of the two-bit b̂ signal are output and used for subsequent computation. In either case, however, only a single bit is fed back through the delay line 264. A timing error estimate, u(m), for PR4 signals require at least a one-bit signal for the b̂(m−1) term used in the v(m,b̂) term. Similarly, a timing error estimate u(m) for the $E^2PR4$ signal can be represented by a single bit for the b̂(m−2) signal, but the EPR4 signal timing error estimate u(m) requires two-bits, one for the b̂(m−1) term and one bit for the b̂(m−2) term. Therefore the output of the b̂-estimate 234 and latch 256 are shown on 2-bits even though only a single bit may be reused for PR4 and EPR4 signals.

An exemplary data and logic structure for the B-HAT RAM is now described with reference to FIG. 15, which shows the RAM computational equations for a $E^2PR4$ signal as implemented in the B-HAT RAM, and the output value corresponding to the particular set of input (address) bits: $A_0, A_1, A_2, \ldots, A_9$. Here the address bits $A_0, A_1, A_2$, and $A_3$ ($A_{3:0}$) represent the four- bits of the current d̂(m), while $A_4$=b̂(m−1), $A_5$=b̂(m−2), $A_6$=b̂(m−3), $A_7$=b̂(m−4), and $A_8$=b̂(m−5). Address bit $A_9$=Mode, where "0" indicates acquisition mode and "1" indicates tracking mode. An "X" designates a bit that may take on either "0" or "1" without affecting the output. The B-HAT output is defined by the four data bits: $D_0, D_1, D_2$, and $D_3$ which represent b̂(m), b̂(m−2), b̂(m−3), and b̂(m−4) respectively. The symbols A, B, C, and D represent the current binary value present at $A_7$, $A_6, A_5$, and $A_4$ respectively. The B-HAT RAM output maps or reflects the address input values as shown in FIG. 15. In other words, the value of the $D_1$ output is always equal to C in the case shown in FIG. 15, which means that the $D_1$ output always has the same binary value as the $A_5$ address input. The symbol ~A refers to the negation of A, that is the "inverse of A" or "A not."

As before, those workers having ordinary skill in the art, in light of this description, will realize that the invention is not limited to the particular equations implemented within the exemplary RAM data structure. They will also appreciate the manner in which analogous equations that define a B-HAT estimator output in terms of particular B-HAT RAM inputs may be defined for PR4 and EPR4 signal types based on the equations for b̂ already presented. Furthermore, some embodiments of the invention need not implement separate acquisition and tracking mode operation so that the B-HAT and D-HAT RAM data structures are correspondingly simplified.

Latch 256 is provided to interface the asynchronous operation of the b estimator 234 with other synchronous components including latch 270 which receives the $\hat{b}$ signal, the $\hat{d}$ signal, and the z signal.

The $\hat{d}$ output of latch 242 is propagated through two added latches 271, 272 so that the $\hat{d}$ signals are delayed two more clock cycles before being input to latch 270. In analogous manner, the read data z(m) from latch 226 is propagated to latch 270 through delay line 274 comprising four linearly cascaded latches 276, 277, 278, and 279. Latch 270 therefore simultaneously receives and stores the following data: two bits of $\hat{b}$, the three bits of $\hat{d}$, and the five least significant bits of the digitized read data z.

These ten bits are then fed to Phase Detector RAM. (PD-RAM) 281 which operates asynchronously and implements the phase detection equation in the form of a look-up or state table, and outputs a four-bit result u(m) to latch 282. The result u(m) is a digital control signal for controlling the sampling clock VCO 283, or in one embodiment the VCO Block 372 (See for example FIG. 20) after passing through Digital-to-Analog Converter (DAC) 284 and Loop Filter 285 (See for example FIG. 20).

The PD-RAM 281 is implemented in a manner analogous to that already described for the B-HAT and D-HAT estimators with a RAM Addressing input block and LUT output(s) associated with each input, for example as illustrated in FIG. 16. In reference to FIG. 17, there is shown an exemplary data structure for the phase detector RAM showing a particular set of inputs and outputs. Ten RAM address bits $A_0, A_1, A_2, \ldots, A_9$ are provided as inputs and 4-bits are provided as outputs. In the embodiment of FIGS. 16 and 17, there are fifteen possible u(m) values. They are "0" and ±1 through ±7. A u(m) zero correction output is represented as the binary output "1000" where D0 is the most significant bit (MSB), "1" in this example. D0 is the sign bit, wherein "1" represents positive correction outputs and "0" indicates that the computed correction is a negative correction. The output "1111" is the maximum value positive correction (here +7), and "0001" is the maximum negative correction (here −7). This numbering representation is convenient for input to a Digital-to-Analog Convertor, but other representations may also be implemented.

The u(m) value is calculated using the formula shown in each row of the output column of FIG. 17 (e.g. (15−0:7)/3 for the first row) as follows (using the first row formula as an example): The term 15−0:7)/3 means the decimal number 15 minus the decimal number represented by the binary value contained in $A_0$ through $A_7$, and that difference divided by 3. Each pair of rows represents the specified range of address inputs. For example, the first row represents the address input range from 0000000000 to 000100011. Among the ten address bit inputs, inputs $A_0, A_1, A_2, \ldots, A_4$ correspond to the read data z(m) (RDAT), inputs $A_7, A_6$, and $A_5$, correspond to the D-HAT estimator outputs, and $A_8$ corresponds to the B-HAT estimator output. The value of $A_9$ determines whether the acquisition mode or tracking mode equations are used to generate the outputs. The address value $A_8$ is indicated as "S", indicating the sign input.

The latches may be implemented using conventional D-type latches such as 10E131, 10E143, or 10E151 made by Motorola Semiconductor and other manufacturers. Latches of this type permit high speed implementation of the described invention using standard off-the-shelf components. The A/D converter is conventional such as a MAX101 made by Maxim Semiconductor. The Equalizer may be of conventional design or an Equalize incorporating the inventive features of the particular inventive equalizer described hereinafter may be implemented to provide the desired signal filtration/equalization. The programmable clock divider is conventional such as a 10EL34 or 10E016 made by Motorola Semiconductor. Programmable dividers of this type permit a high-speed implementation of the described invention using standard off-the-shelf components. The VCO is a conventional varactor tuned oscillator such as model VCO-106 made by Vari-L Corporation. Although, the inventive apparatus has been described with respect to some particular off-the-shelf components, those workers having ordinary skill in the art, in light of this description, will realize that other components having comparable electrical characteristics and/or performing comparable functions may be used. They will also realize that specifically designed circuity or conventional design, may advantageously be employed to practice the invention. For example, such special designs may be provided to reduce circuit areas, and to increase speed by reducing propagation delays, and the like.

Preferred Embodiment of the Inventive Test Instrument

In reference to FIG. 18, which illustrates an embodiment of the inventive test apparatus 301 incorporating the inventive method and structure, and a source of (E)PR4 signals, in this example a conventional magnetic recording disk 302. The (E)PR4 signal source may be of any conventional type of recoding apparatus including rotating magnetic disks, rotating optical disks, magnetic tape systems, any type of a signal receiver for recovering (E)PR4 signals, communication receivers, and any other system from which partial response signals are received. FIG. 18 illustrates operation of the inventive apparatus in the concept of a conventional rotating magnetic disk drive 302 having one or more rotatable magnetic disks 303 on which data are stored. The magnetic disks 303 are supported by a spindle 304, which is driven by a motor 305. A magnetic transducer or read/write head 306 is supported by an actuator 307 which functions in conventional manner to move the read/write head over the surface of the magnetic disk.

The write data to be stored on the magnetic disk recording media are typically received from a data source, such as for example a computer, 308 and stored in binary form. The data may also have undergone some type of conventional encoding prior to recording on the disks 303. Read data is retrieved from the disk 303 and delivered to the requestor, such as computer 308 in conventional manner. Both read data and write data are amplified by preamplifier 309 when sent to, or recovered from, the recording medium 303 via the read/write head 306. A disk controller 310 controls operations of the disk drive 302 components. In a test equipment environment, some components of the conventional disk drive may be absent or disabled during analysis or testing.

Tester 301 comprises a first Gain Controlled Amplifier (GCA1) 321 which receives the read data 311 from the disk drive 302, and is responsive to a Gain Control Signal 312 that is generated by a continuous time amplitude level detection circuit 322 in response to a output from gain controlled amplifier. Preferably, the Amplitude Level Detector Circuit 322 is programmable to adjust the Gain Setting of GCA1 321 and an input filter 323 is interposed between the gain controlled amplifier 321 and the signal location at which the output of GCA 321 is read. Input Filter 323 is preferably a filter bank from which a variety of filter characteristics may be selected. The capability to select different filter characteristics is advantageous in a tester 301 because of the variety of types of electronic components or systems, of which the described magnetic disk drive is one example, that may be tested and which have different output signal characteristics.

The filtered and amplitude leveled signal is fed to a second Gain Controlled Amplifier (GCA2) 326 which also receives a gain control signal 313 from Automatic Gain Control (AGC) system 327 and which control signal 313 functions to adjust the level of the signal entry A/D converter 328. The AGC System 327 is sample based. It is implemented using a RAM based LUT similar to those already described for the B-HAT RAM, D-HAT RAM, and PD-RAM. AGC System 327 generates a two-bit amplitude correction word output at each clock time. The two-bit output has three defined states: "count up" (increase the GCA gain), "count down" (decrease the GCA gain), or "hold" (maintain the last GCA gain).

The output from GCA2 326, which is a filtered and amplified version of the analog read data read from the recording medium 303, is fed to first Analog-to-Digital Converter (A/D1) 328 which generates an 8-bit digital version (hereinafter digitized input data) of the input analog read data signal at a sample rate clock signal (SRC), that is z(m). The generation of the sample rate clock SRC is described hereinafter.

The digital input data from A/D1 328 is fed to a equalizer 330. Operation of equalizer 330 has already been described relative to FIG. 11. Switch 331 is provided to select from either the original digital input data from A/D1 328 or the equalized data generated by equalizer 330 as already described. An Equalizer 330 that can be switched into or out of the circuit is advantageous so that the data may be equalized by an external filter if desired. Eliminating the internal equalization allows the internal delay to be reduced. A particular embodiment of an equalizer 330 is described in greater detail hereinafter. The data will be described as equalized data, even though it should be understood that the equalizer may be switched out of the circuit.

The equalized data is split between a directly addressable capture memory (DACM) 333, a phase-lock loop (PLL) system 340, and automatic gain control system (AGC) 327. The Directly Addressable Capture Memory (DACM) 333 are standard ZIP (or SIMM) static RAM memory modules of conventional design. The Model MCM3264A 64K×32 bit static random access memory module made by Motorola Semiconductor is an addressable memory of suitable design for the DACM. DACM 333 also receives a data rate clock (DRC) signal generated by a clock dividing 344 either internal or external to PLL System 340. The output of DACM 333 is fed to external Digital Signal Processing (DSP) components 341. PLL system also generates sample rate clock (SRC) and feeds the SRC signal to A/D1 328 and to clock divider 314. In the exemplary embodiment, the sample rate clock oscillates at a frequency between about 250 MHZ and about 500 MHZ. The data rate clock oscillates at a frequency of between about 31.25 MHZ and about 250 MHZ. The data rate clock signal generated within the PLL system 340 is also shown as fed back into the PLL system 340.

The PLL system is the heart of the inventive tester and incorporates the invention Timing Error Detector (TED) 201 already described. It receives the 8-bit (equalized or unequalized) digital data signal as described, and processes the digital data signal to generate a sample rate clock signal (SRC) that is frequency and phase corrected to optimumly sample the received partial response read data (e.g. (E)PR4) and optimally recover the original binary data stored on the disk drive 302 or received over another communication channel. For example, FIG. 19 illustrates a communication system 501 having a receiver/antenna 502 for receiving a transmitted signal, and a preamplifier 503 coupled between the receiver/antenna 502 and the gain controlled amplifier (GCA 1). The inventive method and structure may be applied to various other communication and information transmission channels, including but not limited to hard-wired and wireless communication channels.

Preferred Embodiment of Phase/Frequency Detector Loop

Figure 20:
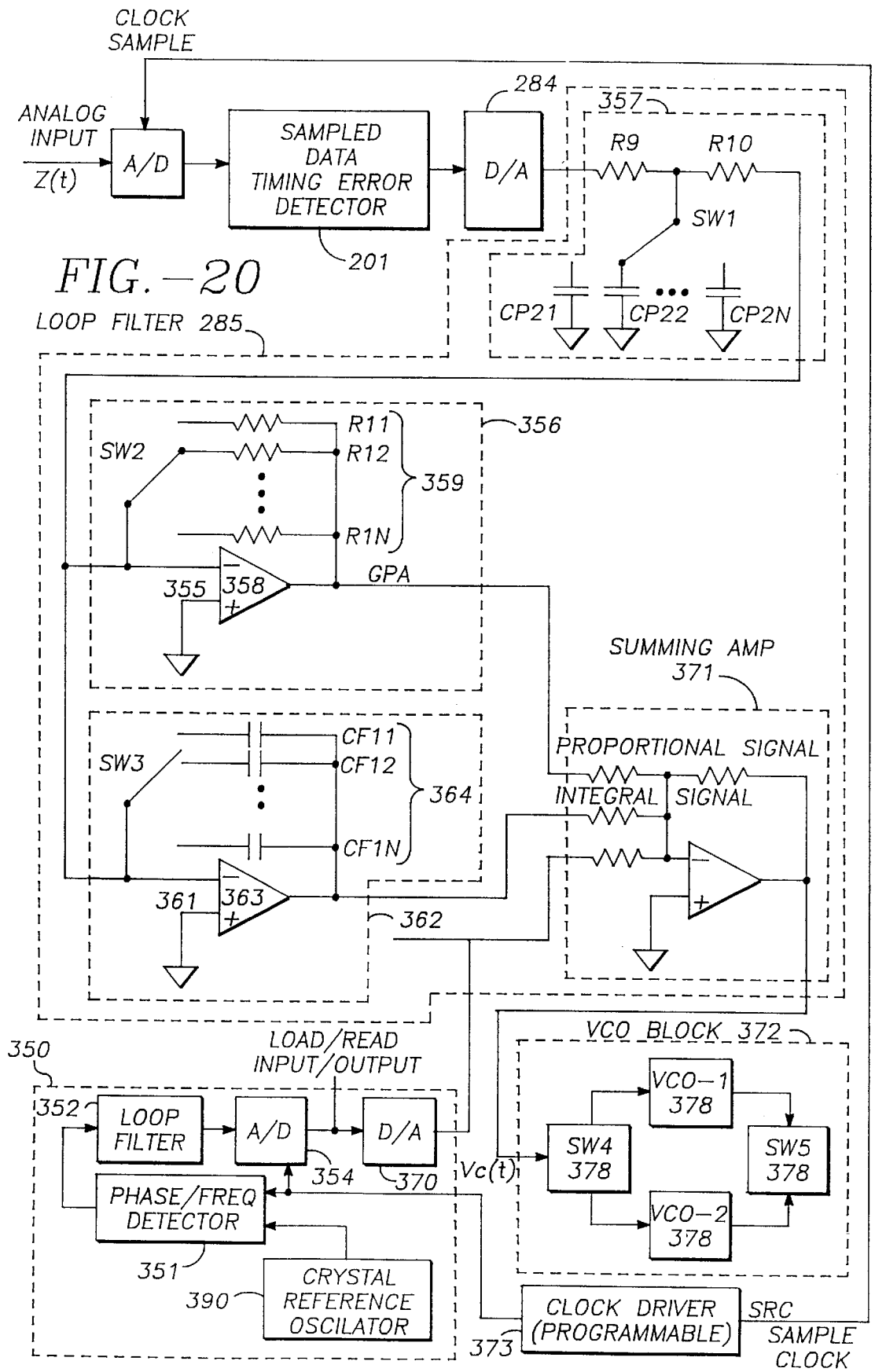
FIG. 20 is a diagrammatic illustration showing an exemplary embodiment of the PLL incorporating the inventive timing error detector.

One embodiment of the inventive structure is illustrated in FIG. 20, showing particularly the relationship between the output of a conventional phase/frequency detector component (PFD) 350, and the inventive sampled data TED 201. Conventional PLL circuit 350 comprises a phase/frequency detector 351, a loop filter 352, a crystal reference oscillator 353, an A/D convertor 354, and a D/A convertor 370.

As already described, the phase detector RAM 281 of TED 201 generates an output digital control signal $u_D(m)$ which is latched by latch 282, and converted to an analog equivalent $u_A(t)$ by DAC 284. The signal $u_A(t)$ is applied to the input port 355 of proportional amplifier 356, through a resistive/capacitance network 357, and having a variable gain $G_{PA}$ and generating an output signal proportional to the input signal $u_A(t)$. In FIG. 20, the proportional amplifier 356 is shown as an op-amp 358 configured as an inverting amplifier, and having a plurality of resistors in a bank of resistors $R_{11}, R_{12}, \ldots, R_N$ coupled through a switch SW2 359 between the op-amp 358 output port and inverting input terminal of the amplifier so that the gain of the amplifier GPA may be switchable selected to vary the output level. The resistive/capacitive network comprises the serial combination of resistors $R_9$ and $R_{10}$ and a bank of capacitors $CP_{21}, CP_{22}, \ldots, CP_{2N}$ connected between the common node shared by $R_9$ and $R_{10}$ and ground through switch SW1 355. Of course, a single variable capacitor or equivalent network may replace the bank of capacitors.

The signal $u_A(t)$ is also applied to the input port 361 of an integrating amplifier 362, through the same resistive capacitor network 357, and having, Gain $G_{IA}$ and a variable time constant $\tau_{IA}$ and generating an output signal proportional to the integral of the input voltage signal $u_A(t)$. In FIG. 20, the integrating amplifier 362 is shown as an op-amp 363 configured as an integrator, and having a plurality of capacitors 364 in a bank of capacitors $CF_{21}, CF_{22}, \ldots, CF_{2N}$ coupled through a switch SW3 365 between the op-amp 363 output port and inverting input terminal of the op amp so that the time constant of the amplifier 362 may be switchable selected. The resistive capacitor 357 network is the same combination of resistors $R_9$ and $R_{10}$ and capacitors $CP_{21}$, $CP_{23}, \ldots, CP_{CN}$ already described for the proportional amplifier 356.

The values of the resistors (e.g. $R_9$, $R_{10}$, and $R_{11}$–$R_N$) and the capacitors (e.g. $CF_{11}$–$CF_N$) are calculated using conventional Proportional Plus Integral control loop theory, the most common control loop in PLL applications. The values of capacitors $CP_{21}$–$CP_N$ are calculated as "third pole" filter capacitors to limit reference feed-through, also of conventional design. Switches SW1 through SW3 are operated to select appropriate loop filter values necessary for the wide range of data rates supported in preferred embodiment test equipment system described.

The proportional signal $v_{PS}(t)$, the integral signal $v_{IS}(t)$, and an analog control signal $v_{PD}(t)$ generated by the conventional phase/frequency detector 350 are applied as inputs to the inverting terminal of summing amplifier 371 to generate a VCO control signal $v_C(t)$ to control the frequency of the voltage controlled oscillator (VCO) block 372. In turn, VCO block 372 produces the phase and frequency corrected sample rate clock signal (SRC) which is split between A/D converter 102 and programmable clock divider 373. The sampled data timing error detector 201 and the phase/frequency detector 351 operate to control the VCO in a mutually exclusive manner. The two control loops are referred to here as the "Idle Loop" and the "Sampled-Data Loop."

The Idle Loop uses the phase/frequency detector 351 to establish phase and frequency lock of the crystal reference oscillator 390. In the particular embodiment described herein, the frequency established by this Idle Loop is nearly equal to that which will be locked to by the Sampled-Data Loop when it ultimately establishes phase and frequency lock based on the A/D converted analog input sample values. When the system switches from the Idle Loop to the Sampled-Data Loop operation, the digital input to D/A 370 is held, thereby establishing a quiescent DC control signal to summing amplifier 371, which enables the Sampled-Data Loop to start operation with a nearly exact frequency output of the VCO. When the system switches from Sampled Data Loop operational mode to Idle Loop operating mode, the sampled data timing error detector 201 output is held at zero, and the integrator filter capacitors, $CF_{11}$–$CF_N$ are shorted.

Although, test instrument according to the inventor may utilize a single VCO in VCO block 372, in a preferred embodiment of the invention, VCO block 372 comprises first and second VCO's VCO-1 376 and VCO-2 377, and first and second switches SW4 378 and SW5 379. The control signal $v_c(t)$ is fed through switch SW4 to couple the received signal to either VCO-1 376 or VCO-2 377. The control signal is fed to VCO-1 which provides an upper frequency range oscillator signal. The switch positions of switches SW4 and SW5 are coupled so that when VCO-1 is in the circuit VCO-2 is out of the circuit and vice versa. Each of switches SW1, SW2, SW3, SW4, SW5, and SW6 may be any type of switches including switches having physical contacts, electronic switches, transistors, and the like.

Preferred Embodiment of the Inventive Equalizer

An embodiment of Equalizer (EQL) 210 is now described with reference to FIGS. 21–26. The exemplary equalizer is a seven-tap, odd-symmetric Finite impulse response (FIR) filter. The seven-tap filter is illustrated in the block diagram of FIG. 21. The digital input data from A/D1 is propagated serially through the seven taps. Operation of the illustrated embodiment of the Equalizer is now described.

The Equalizer (EQL) provides real-time digital filtering to a byte-wide data stream, supporting byte clock rates of up to about 250 Mhz. A particular embodiment of the inventive Equalizer designed and configured on a plug-in printed circuit board to interface to a standard VXI bus interface is now described with respect to the functional block diagram in FIG. 21. The inventive Equalizer is moe general than the particular VXI compatible embodiment, therefore although some particular characteristics of the Equalizer board design compatible with the VXI bus interface are described, they are no shown in the figures.

The Equalizer connects to the Local Bus via two connectors, P1 and P2, of a Local Bus Interface, both DIN-96RAL (NuBus) connectors. The VXI bus provides electrical power for the Equalizer. Although no data is transferred to/from the Equalizer via the Local Bus, the Local Bus is propagated as required by the standard VXI specification, which version of the VXI specification curent as of the filing date of this patent application is hereby incorporated by reference.

Two signals (LOint# and UPint#) are optionally driven onto the Local Bus for purposes of asserting interrupts. These two interrupts can be individually enabled/disabled under I/O software control. The interrupts correspond to an Under-Voltage or Over-Temperature condition as sensed on board. Over-Temperature is asserted (when enabled) on one pin (pin P2-88), while Under-Voltage (when enabled) is asserted on a second pin (pin P2-91). In the embodiment of the equalizer designed for coupling to the standard VXI instrumentation bus, the circuit optionally includes an Under Voltage Sensor which "trips" when the magnitude of the –5.2V supply drops below some predetermined threshold voltage level. An Over Temperature Sensor is also optionally provided which "trips" when the temperature of the board reaches some predetermined temperature that is at or near the maximum range for acceptable (or safe) operation. Power is distributed on board via internal power planes. Each main power line is fused via 5 amp fast-acting fuses. Power is sourced via the two VXI backplane connectors, P1 and P2.

Equalizer 210 is programmed (write) and queried (read) via Read/Write Control Registers having characteristics illustrated in FIG. 25. For this particular EQL embodiment, the base register for input/output (I/O) is 60H. Addresses are specified as Base+offset. Data bits are described (from left to right) High order to Low order.

Clocks for the Equalizer 210 are generated via two input sources. The first source is from connector J2 (pins 28 and 29) which is normally sourced as a differential data clock synchronous with data from the PLL board. The second source is a synthesized clock from connector J3 when a write is issued to port Base+11H (see Write Registers above). These two clocks are multiplexed into one system clock which is distributed throughout the Equalizer board. The system clock is distributed using four 9-wide 10E111 Clock Distribution devices. All clock lengths are controlled to minimize skew. Equalizer 210 uses a 10 stage synchronous pipelined architecture which requires closely balanced clock lengths.

The EQL 210 is implemented as a 7-tap, symmetrical digital FIR filter. The particular implementation is provided as a board designed and configured for operation in a VXI enclosure capable of delivering 15 AMPs of dedicated –5.2V current. The board operates at clock speeds up to 200 MHz (MBytes)/Sec and is built using off-the-shelf components. The equalizer comprises a filter having a 10-stage pipeline implementation, performing discrete time correlations using memories and latches as the primitive functional building blocks. These building blocks provide for an architecture which is both regular and very high speed. The primitive blocks are used to make higher level functional components.

These functional components comprise of a 7-tap Shift Register (T1–T7), 8-bit adder (Add8), 12-bit expression evaluator (Expr. Eval.), a 12 bit adder (Add12), a 12-bit multi-function module including adder (Madd12), number representation converter (OutCon) including a fault indicator functional component, and an Output Mapper (Map Out). The purpose of each of these functional components are described below. The functional subcomponents are built from memory and latch primitives are described below.

Figure 21:
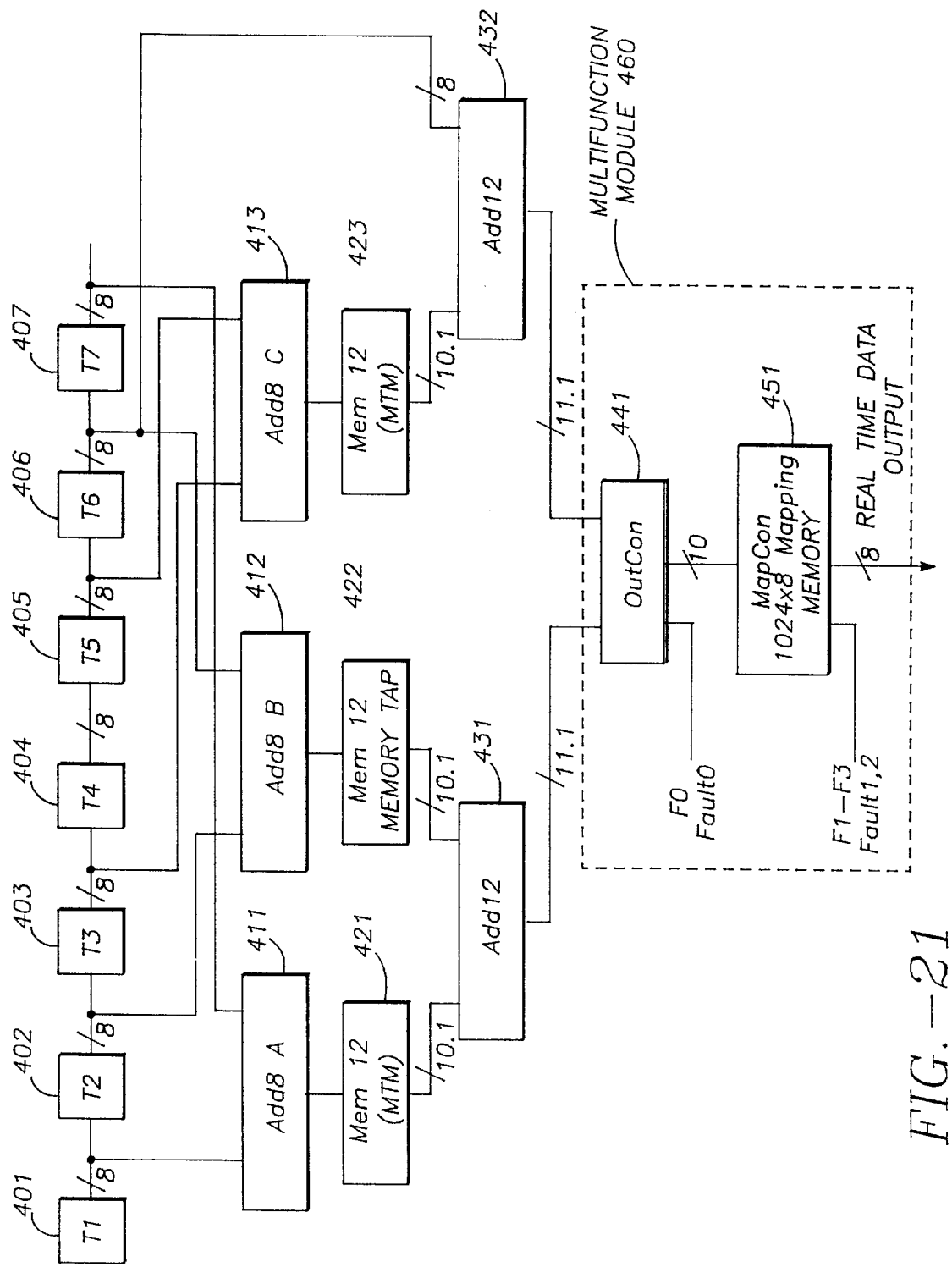
FIG. 21 is a diagrammatic illustration showing an overall block diagram of an exemplary embodiment of the FIR Equalizer.

With reference to FIG. 21, the 7-Tap Shift Register provides parallel access to 7 byte-wide data points, spaced equally in time. The physical layout of the shift register is implemented in the shape of a horseshoe to provide physical access to symmetric points in the filter. Data is advanced through this byte-wide shift register on every clock cycle. The center tap in a 7-tap implementation is usually Tap 4 (T1 is the first tap). In this implementation, in order to save power and printed circuit board (PCB) space, the Center Tap was shifted backward (delayed in time) by 2 clocks to Tap 6, and merged into the pipeline at a later stage. The outputs of taps T1 401 and T7 407, T2 402 and T6 406, and T3 403 and T5 405, are each fed to adders Add8A 411 Add8B 412, and Add8C 413 respectively.

Figure 22:
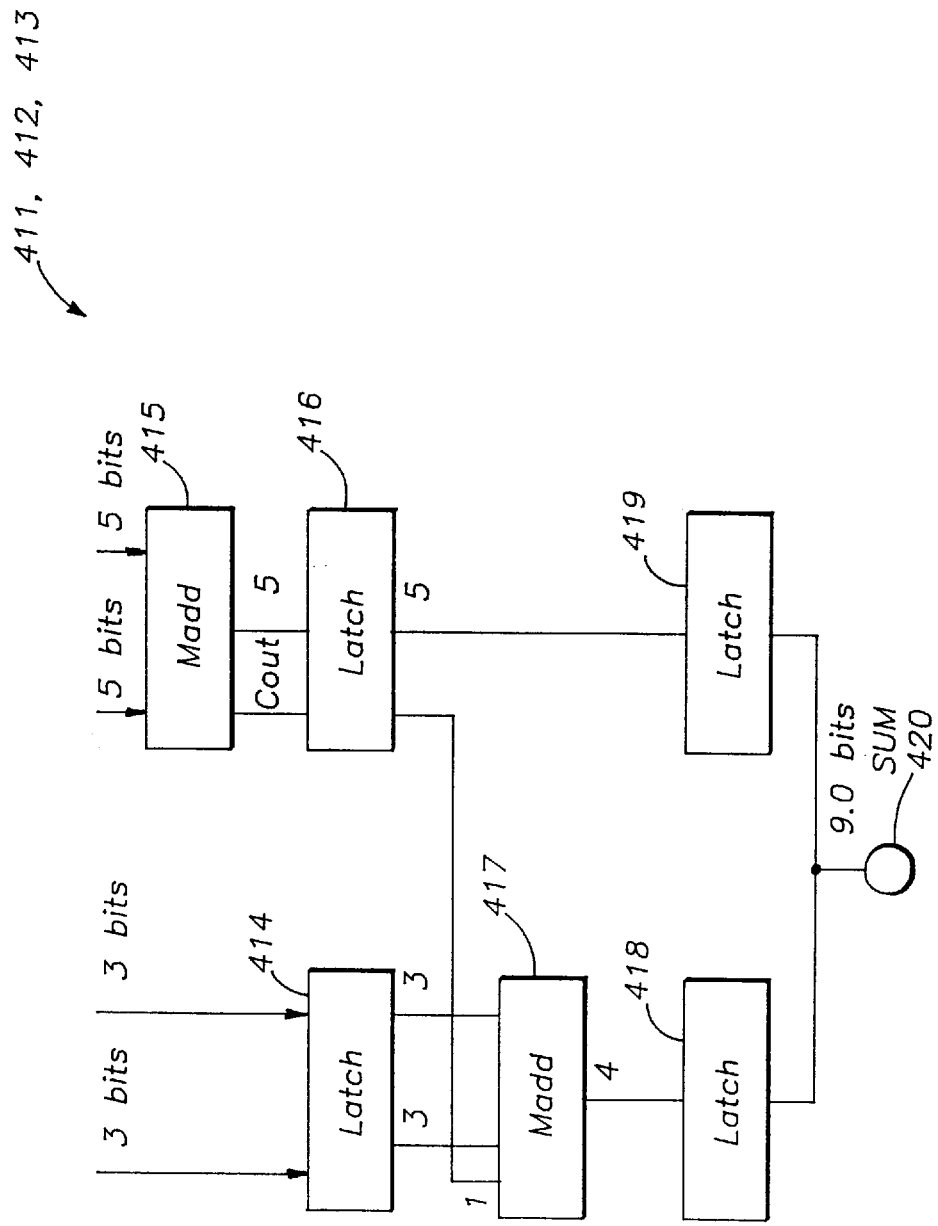
FIG. 22 is a diagrammatic illustration showing an exemplary structure for the ADD8 function block of the FIR Equalizer in FIG. 21.

The structure of each Add8 block is illustrated in FIG. 22 and the inputs and outputs are described relative to taps T1 401 and T7 407. The 8-bit adder takes in two 8-bit addends and outputs a 9-bit sum 420 in two clock cycles. Each Add8 functional block 411, 412, 413 is composed of a 5-bit adder with carry-out, followed by a 3-bit adder with carry-in. All adders are preferably implemented with fast static rams. With reference to FIGS. 21 and 22, the two 8-bit addends from T1 and T7 are fed to a dual three-bit latch 414, while five bits of each of T1 and T7 are fed to five-bit adder block (Madd) 415 receiving each of the first and second addends from the taps and having a five-bit partial sum output and a carry-out bit ($C_{out}$) which are received by six-bit latch 416. The three-bit outputs from taps T1 and T7, and the carry-out bit from latch 416 are fed to a second 3-bit adder with carry-ins (Madd) 417 which generates a four-bit output. The four-bit output from Madd 417 are fed to latch 418, while the five bit output from latch 416 are fed to an additional latch 419, which in combination provide the 9-bit sum output 420 in two clock cycles. Second and third sets of nine-bit outputs are generated from the outputs of taps T2 402 and T6 406, and from T3 403 and T5 405 respectively in similar manner to that described for T1 and T7.

The outputs of each of the adder functional blocks Add8A 411, Add8B 412, and Add8C 413, are each propagated to one of Memory Tap Multipliers (also termed Expression Evaluators) (Mem12 or MTM) 421, 422, and 423 respectively. The MTMs or Expression Evaluators 421, 422, and 423 have been included to perform number representation functions and Tap Weight multiplications for each Tap Weight. The expression evaluator takes a 9-bit input and outputs a 10-bit (9 whole bits and 1 fractional bit) number which can be any expression of a single variable. In addition, a 10th bit in the input stream can switch between alternate expression evaluations. The alternate expression is preferably switched under I/O control. Although the expression evaluator may be implemented to perform any of various functions, one embodiment of the expression evaluator performs the following function: Output=(Input−254)×(Tap Weight)/(Center Tap Weight)+256. Thus the Expression Evaluator translates the input number "down" by 254, multiplies it by the current tap weight, scales it by the center tap weight, and then translates the result back "up" by 256. This expression allows the basic functionality of providing a fixed center tap weight of 1.0 to be extended to values other than 1 with minimum loss of overall accuracy and at minimum cost.

With further reference to FIG. 21, the outputs from each MTM 421, and 422 are fed to 12-bit adder (Add12A) 431, while the output from MTM 423 and the 8-bit output from tap T6 406 are fed to a second 12-bit adder (Add12B) 432. One embodiment of the 12-bit adder (Add12A and Add12B) has the structure illustrated in FIG. 23. The 12-bit adder comprises an embedded 8-bit adder (Add8) (see structure of FIG. 22 and the description above) followed by a 4-bit adder (Madd). The input comprise two 11-bit addend numbers (10 whole bits, and 1 fractional bit) while the output comprises a 12-bit sum number (11 whole bits, and 1 fractional bit). The add operation is performed in 3 clock cycles.

Figure 23:
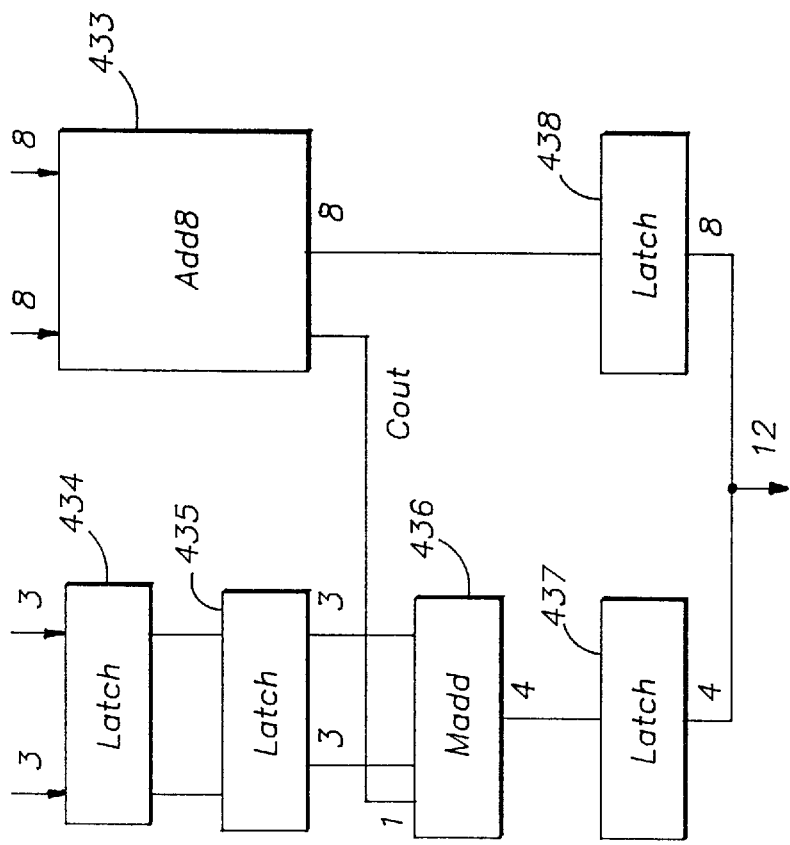
FIG. 23 is a diagrammatic illustration showing an exemplary structure for the ADD12 function block of the FIR Equalizer in FIG. 21.

The structure of the Add8 block 411, 412, 413 illustrated in FIG. 23 is generally repeated as a component of each Add12 block 431, 432. Eight-bits from each of the MTM 421, 422, 423 outputs are fed to the Add8 433 component and spread between the Madd 436 and the latch 438 units as already described. The output of Add8 component 433 is an 8-bit partial sum and a 1-bit carry-out. The other 3-bits from each MTM 421 output are fed to two serially connected latches 434, 435 before propagating to Madd 436, which also receives the carry-out bit from the Add8 block 433, and generates a 4-bit output which is latched by latch 437. The output of Add8 component 433 is latched by latch 438, and the outputs of 4-bit latch 437 and 8-bit latch 438 are propagated to an output conversion block (OutCon) 441. In analogous manner, the output from MTM 423 and the 8-bit output from tap T6 406 are fed to a second adder (Add12 B) 432, but serially connected latches 434, 435 receive only the 3-bit output of MTM 423 since tap T6 is already constrained to 8-bits.

The 12-Bit Multifunction Module 460 includes several components. The output conditioner, OutCon 441, performs the final sum of all the partial products received from Add12 431 and Add12 432. OutCon takes two 12-bit numbers as input (11 whole bits, and 1 fractional bit, that is "11.1") and outputs a number which is 9-bits wide (8 whole bits, and 1 fractional bit, that is "8.1"). In addition to adding the two inputs to form the final sum, the resultant number is compared against upper and lower predetermined and stored number limits to determine if the resultant sum-of-products is still within the original 8-bit input range. In addition to the 8-bits of output, a fault bit (readable by I/O) and two fault communication bits (destined for the Output Mapper as described below) are also provided by this module.

In one implementation of OutCon 441, the sum-of-products is restored to a number which between 00H and FFH (representing the upper and lower range, here −127 millivolts to +128 millivolts). If an underflow or an overflow has occurred, two "signaling" bits are passed along with the data to the Mapout Module. The highest order signaling bit is a copy of the fault bit (1=fault, 0=OK), while the next highest signaling bit indicates overflow or underflow (1=Overflow, 0=underflow). The conditions of overflow and underflow are desirable because the weighted sum of inputs and tap weights can result in a dot product which is less than −127 millivolts or greater than +128 millivolts. Of course the fault detection strategy may be implemented with other predetermined rules.

Figure 24:
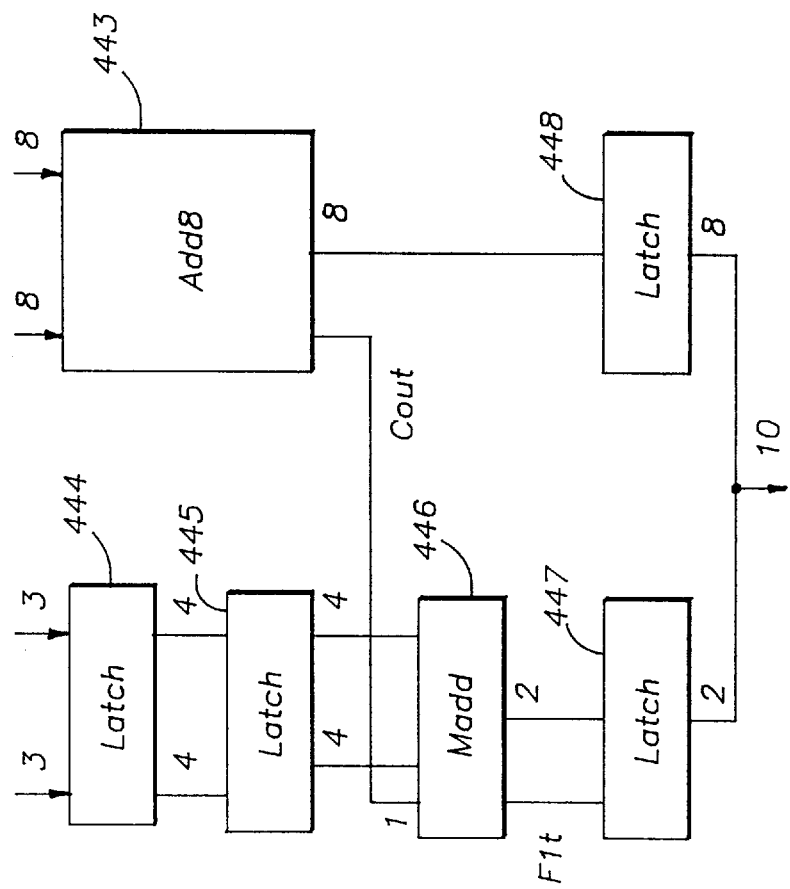
FIG. 24 is a diagrammatic illustration showing an exemplary structure for the OUTCON function block of the FIR Equalizer in FIG. 21.

One exemplary structure for the output conversion block (OutCon) 441 is illustrated in FIG. 24. The structure of the OutCon block 441 is similar to the structure of the Add12 blocks, except that the latches 444, 445, and the Madd 446 store and propagate 4-bit signals, and Madd 446 generates a 2-bit partial sum and a 1-bit fault signal. The 10-bit output signal from OutCon 441 is fed to a Mapping Memory (MapOut) block 451, that contains a 1024×8 bit mapping memory as described.

The Output Mapper functional block (MapOut) 451 is actually an Expression Evaluator (see description earlier) which is configured by software programming to perform several functions. MapOut 451 receives as input one 9-bit number and two communication bits. These Communication bits are used as Fault indicators for sum-of-products which result in an "out-of-range" sum. MapOut 451 evaluates the following expression: Output=(Input−127)×(Center Tap Weight)+127. The input to the MapOut functional block is translated "down" by 127, then weighted by the Center Tap and retranslated back "up". If an overflow or underflow is reported by the input Communication bits, MapOut 451 will map the output value to 0 or FF. This performs the operation of "pegging" values which are out of range to the maximum/minimum values possible. MapOut 451 also provides three general purpose outputs. Two of these outputs are used to communicate the Fault conditions of Overflow and Underflow bits (passed through from the previous Outcon module) back via I/O control (see Read Registers above). These general purpose output bits can be used for such purposes as "trigger bits", among other things. A trigger bit provides a readable output bit when output values of the equalizer cross (or equal) a preprogrammed threshold. This bit can be used to software-adjust gain, or to trigger test equipment. The output of the MapOut 451 module, that is equalized z(m) values, is also readable by a controller that is used to load the control components which are implemented by RAMs. The desired information is input onto the data paths and then write enable signals are asserted to store the information on the data paths to the selected RAM storage locations or registers.

Figure 26:
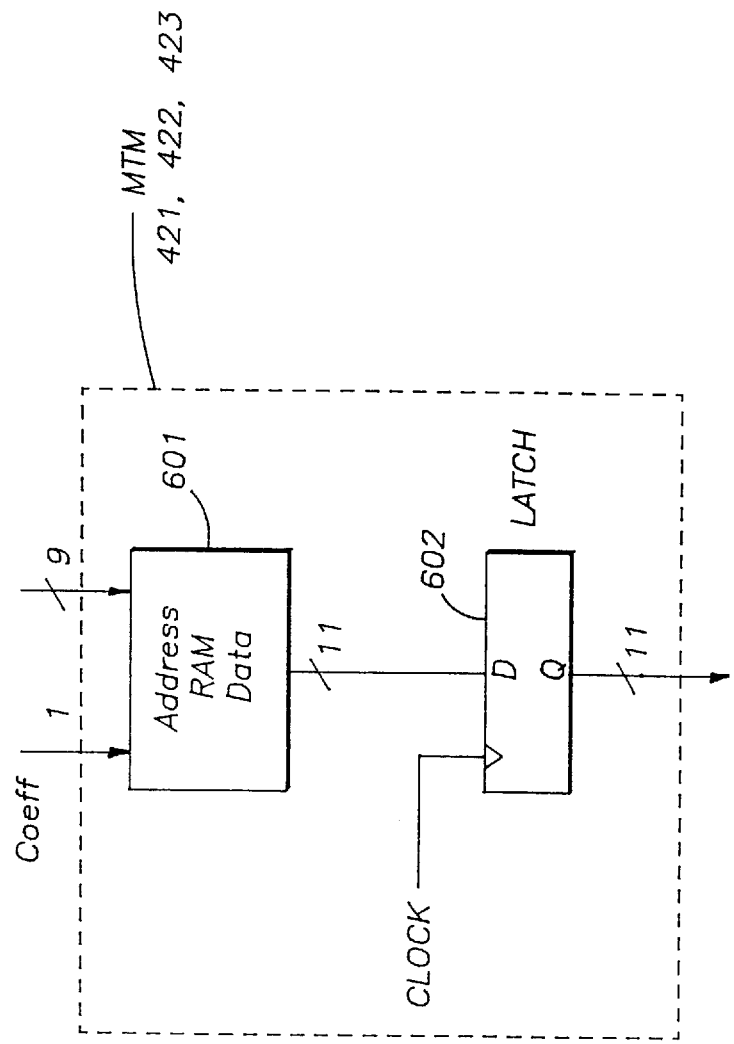
FIG. 26 is a diagramatic illustration of an embodiment of a Memory Tap Multiplier or Expression Evaluator according to the invention.

An exemplary embodiment of Memory Tap Multiplier (Expression Evaluator) 421, 422, 433 is illustrated in FIG. 26. The MTM includes an addressible RAM 601 having a 10-bit address input and an 11-bit data output whih is latched by latch 602, whcih also receives a clock signal at the DRC rate. MTM-RAM 601 structure and operation are analogous to that already described for the PD-RAM.

The 8-bit output from the MapOut 451 represent the equalized read data signal which is fed to the DACM 333, the PLL system 340, and the AGC System 327 as already described.

All publications and patent applications mentioned in this specification are herein incorporated by reference to the same extent as if each individual publication or patent application was specifically and individually indicated to be incorporated by reference. The invention now being fully described, it will be apparent to one of ordinary skill in the art in light of this description, that many changes and modifications can be made thereto without departing from the spirit or scope of the appended claims.

We claim:

1. A timing-error detector comprising:
    a input port for receiving input data signal z(m) from an external data signal source;
    first estimator means receiving said input data signal and generating a first output signal representing an estimated value of the multilevel data estimate $\hat{d}(m)$, and generated by normalizing the amplitude of the sampled incoming input data signal z(m) to one of a predetermined number of levels and then rounding or quantizing said normalized signal to the nearest allowable multilevel value to generate the multilevel data estimates $\hat{d}(m)$;
    second estimator means receiving said first output signal and generating a second output signal representing an estimated value of the binary data $\hat{b}(m)$, and generated estimated recursively from measurement of $\hat{d}(m)$ and knowledge of previous estimates of previous values of $\hat{b}(m)$;
    phase detector means receiving said input data, said first output signal, and said second output signal, and generating a output error control signal at a control signal output port for use in aligning the sampling strobe timing such that the strobe coincide or nearly coincide with the instants of ideal signal levels; and
    delay means for aligning the temporal relationships between said input data signal, said first output signal, and said second output signal for input to said phase detector.

2. In a data recording system storing data on a recording medium in digital form, a method for recovering timing information from read signals derived from partial-response signals, said method comprising the steps of:
    receiving a sampled NRZ input data signal z(m) from an external data signal source;
    generating an first estimated value of the multilevel data estimate $\hat{d}(m)$ from the NRZ input data signal z(m);
    generating a second estimated value of the binary data $\hat{b}(m)$ recursively from measurement of $\hat{d}(m)$ and knowledge of estimates of previous values of $\hat{b}(m)$;
    generating a output error control signal u(m) based on a predetermined relationship between said z(m), and first $\hat{d}(m)$ and second $\hat{b}(m)$ estimates.

3. The method in claim 2, wherein:
    said multilevel data estimate $\hat{d}(m)$ is an estimate selected from the allowable levels of the particular (E)PR4 signal type;
    said binary data estimate $\hat{b}(m)$ is generated according to the expression $v(m,\underline{b})$; and
    said output error control signal u(m) is generated according to the expression $u(m)=v(m,\underline{b}) \times e(m)$, where $e(m)=z(m)-\hat{d}(m)$.

4. A signal sampling system for sampling an analog input data signal, said system comprising:
    signal sampling means for sampling said analog input data signal in response to a sample time control signal and generating a sampled analog signal;
    an analog-to-digital converter for receiving said sampled analog signal and generating a sampled digital signal representation of said sampled analog signal;
    a timing error detector having an input port receiving said digital signal and generating a timing error control signal u(m) at an output port of the form $u(m)=v(m,\underline{b}) \times e(m)$, where $e(m)=z(m)-\hat{d}(m)$, and where $\hat{d}(m)$ represents the multilevel data estimate of the partial response data signal z(m); and
    a voltage controlled oscillator (VCO) receiving said timing error control signal and generating said sample time control signal in response thereto.

5. A signal sampling system for sampling an analog input data signal, said system comprising:
    signal sampling means for sampling said analog input data signal in response to a sample time control signal and generating a sampled analog signal;
    analog-to-digital converter for receiving said sampled analog signal and generating a sampled digital signal representation of said sampled analog signal;
    a timing error detector having an input port receiving said digital signal and generating a timing error control signal u(m) at an output port of the form $u(m)=v(m,\underline{b}) \times e(m)$, where $e(m)=z(m)-\hat{d}(m)$, and where $v(m,\underline{b})$ and $\hat{d}(m)$; and
    a voltage controlled oscillator (VCO) receiving said timing error control signal and generating said sample time control signal in response thereto.

6. The sampling system in claim 5, wherein said input signal is a digital representation of a PR4 type partial response signal, wherein $\hat{d}(m)=(0, \text{ or } \pm 2A)$, and wherein the function $v(m,\underline{b})$ is of the form: $v(m,\underline{b})=\hat{b}(m-1)$.

7. The sampling system in claim 5, wherein said input signal is a digital representation of an EPR4 type partial response signal, wherein $\hat{d}(m)=(0, \pm 2A, \text{ or } \pm 4A)$, and wherein the function $v(m,\underline{b})$ is of the form: $v(m,\underline{b})=\hat{b}(m-1)+\hat{b}(m-2)$.

8. The sampling system in claim 5, wherein said input signal is a digital representation of an $E^2PR4$ type partial response signal, wherein $\hat{d}(m)=(0, \pm 2A, \pm 4A, \text{ or } \pm 6A)$, and wherein the function $v(m,\hat{\underline{b}})$ is of the form: $v(m,\hat{\underline{b}})=\hat{b}(m-2)$.

9. The sampling system in claim 5, wherein said input signal is a PR4 type partial response signal and wherein the binary data estimates are of the form: $\hat{b}(m)=\text{sgn}[z(m)-\hat{b}(m-2)]$, where $\text{sgn}[x]$ is defined as +1 for $x \geq 0$ and −1 for $x \leq 0$.

10. The sampling system in claim 5, wherein said input signal is an EPR4 type partial response signal and wherein the binary data estimates are of the form: $\hat{b}(m)=\text{sgn}[z(m)-\hat{b}(m-1)+\hat{b}(m-2)+\hat{b}(m-3)]$, where $\text{sgn}[x]$ is defined as +1 for $x \geq 0$ and −1 for $x \leq 0$.

11. The sampling system in claim 5, wherein said input signal is an $E^2PR4$ type partial response signal and wherein the binary data estimates are of the form: $\hat{b}(m)=\text{sgn}[z(m)-2\hat{b}(m-1)+2\hat{b}(m-3)+\hat{b}(m-4)]$, where $\text{sgn}[x]$ is defined as +1 for $x \geq 0$ and −1 for $x \leq 0$.

12. The sampling system in claim 5, wherein said input signal is a PR4 type partial response signal and wherein the binary data estimates are of the form: $\hat{b}(m)=\hat{d}(m)-\hat{b}(m-2)$.

13. The sampling system in claim 5, wherein said input signal is an EPR4 type partial response signal and wherein the binary data estimates are of the form: $\hat{b}(m)=\hat{d}(m)-\hat{b}(m-1)+\hat{b}(m-2)+\hat{b}(m-3)$.

14. The sampling system in claim 5, wherein said input signal is an $E^2PR4$ type partial response signal and wherein the binary data estimates are of the form: $\hat{b}(m)=\hat{d}(m)-2\hat{b}(m-1)+2\hat{b}(m-3)+\hat{b}(m-4)$.

15. The sampling system in claim 5, further comprising an equalizer filter interposed between the output of said analog-to-digital converter and said input port of said timing error detector.

16. The sampling system in claim 15, further comprising a loop-filter interposed between said output of the timing error detector and the input port of said VCO.

17. A timing error detector comprising:
an input port for receiving a strobe signal input;
a d-hat estimator means for generating a $\hat{d}(m)$ estimate of the multilevel data value in response to said received input strobe signal;
a b-hat estimator means for generating a $\hat{b}(m)$ estimate of binary value of the strobe signal of the form $v(m,\hat{\underline{b}})$;
combiner means for combining said estimated multilevel estimate $\hat{d}(m)$ with said corresponding input strobe signal $z(m)$ to generate a signal of the form $e(m)=z(m)-\hat{d}(m)$;
phase detector means for generating a control signal $u(m)$ from received estimate $v(m,\hat{\underline{b}})$ and received $e(m)$ of the form $u(m)=v(m,\hat{\underline{b}}) \times e(m)$.

18. The timing error detector in claim 17, wherein said d-hat estimator comprises:
an addressable memory for storing a plurality of data values and having an address input port and a data output port; and
a memory controller for providing a predetermined output data at said output port in response to a predetermined input received at said address input port.

19. The timing error detector in claim 18, wherein each of said b-hat estimator comprises:
an addressable memory for storing a plurality of data values and having an address input port and a data output port; and
a memory controller for providing a predetermined output data at said output port in response to a predetermined input received at said address input port.

20. The timing error detector in claim 19, wherein each said addressable memory comprises a random access memory (RAM).

21. The timing error detector in claim 20, wherein said phase detector comprises:
an addressable memory for storing a plurality of data values and having an address input port and a data output port; and
a memory controller for providing a predetermined output data at said output port in response to a predetermined input received at said address input port.

22. The timing error detector in claim 21, wherein said d-hat estimator means, said b-hat estimator means, and said phase detector means operate asynchronously relative to a data rate clock signal, and wherein each of said d-hat estimator means, said b-hat estimator means, and said phase detector means includes latch means responsive to said data rate clock signal; and further comprises at least one signal propagation delay means for temporally aligning output signals generated by at least one of said b-hat estimator, said d-hat estimator, and said strobe input signal.

23. An instrument for receiving a partial response signal received from an external signal generator source, and for determining characteristics of said signal and indirectly of said signal generator, said instrument comprising:
an input port for receiving said partial response signal from said external signal generator source;
gain controlled amplifier means coupled to said input port for amplifying said input signal;
an analog-to-digital convertor coupled to said amplifier means for receiving said amplified signal and for generating a digital representation of said received signal;
a phase-locked loop system receiving said digital signal and generating a control signal $u(t)$ and a sample rate clock signal aligned with an optimum time for sampling said analog input signal to said analog-to-digital converter, said phase-lock loop system including a sampled data timing error detector and a phase frequency detector.

24. A system for receiving partial response signals from an external partial response signal generator source and for generating binary values in response thereto, said system comprising:
an input port for receiving said partial response signal from said external signal generator source;
gain controlled amplifier means coupled to said input port for amplifying said input signal;
an analog-to-digital convertor coupled to said amplifier means for receiving said amplified signal and for generating a digital representation of said received signal;
a phase-locked loop system receiving said digital signal and generating a control signal $u(t)$ and a sample rate clock signal aligned with an optimum time for sampling said analog input signal to said analog-to-digital converter, said phase-lock loop system including a sampled data timing error detector and a phase frequency detector;
said phased-locked loop system further including:
a signal sampling system for sampling an analog input data signal including:
signal sampling means for sampling said analog input data signal in response to a sample time control signal and generating a sampled analog signal;

an analog-to-digital converter for receiving said sampled analog signal and generating a sampled digital signal representation of said sampled analog signal;

a timing error detector having an input port receiving said digital signal and generating a timing error control signal $u(m)$ at an output port of the form $u(m)=v(m,\hat{b})\times e(m)$, where $e(m)=z(m)-\hat{d}(m)$, and where $v(m,\hat{b})$ and $\hat{d}(m)$; wherein said timing error detector further includes:

a input port for receiving input data signal $z(m)$ from an external data signal source;

first estimator means receiving said input data signal and generating a first output signal representing an estimated value of the multilevel data estimate $\hat{d}(m)$, and generated by normalizing the amplitude of the sampled incoming input data signal $z(m)$ to one of a predetermined number of levels and then rounding or quantizing said normalized signal to the nearest allowable multilevel value to generate the multilevel data estimates $\hat{d}(m)$;

second estimator means receiving said first output signal and generating a second output signal representing an estimated value of the binary data $\hat{b}(m)$, and generated estimated recursively from measurement of $\hat{d}(m)$ and knowledge of previous estimates of previous values of $\hat{b}(m)$;

phase detector means receiving said input data, said first output signal, and said second output signal, and generating a output error control signal at a control signal output port for use in aligning the sampling strobe timing such that the strobe coincide or nearly coincide with the instants of ideal signal levels; and delay means for aligning the temporal relationships between said input data signal, said first output signal, and said second output signal for input to said phase detector; and a voltage controlled oscillator (VCO) receiving said timing error control signal and generating said sample time control signal in response thereto; and an equalizer filter interposed between the output of said analog-to-digital converter and said input port of said timing error detector; and a loop-filter interposed between said output of the timing error detector and the input port of said VCO.

25. The system in claim 24, wherein said input signal comprises a digital representation of a partial response signal selected from the group consisting of PR4, EPR4, and $E^2$PR4 type partial response signals, and wherein:

for said PR4 type signal said $\hat{d}(m)=(0, \text{ or } \pm 2A)$ and said function $v(m,\hat{b})$ is of the form: $v(m,\hat{b})=\hat{b}(m-1)$, and $\hat{b}(m)=\text{sgn}[z(m)-\hat{b}(m-2)]$, where $\text{sgn}[x]$ is defined as $+1$ for $x\geq 0$ and $-1$ for $x\leq 0$;

for said EPR4 type signal said $\hat{d}(m)=(0, \pm 2A, \text{ or } \pm 4A)$ and said function $v(m,\hat{b})$ is of the form: $v(m,\hat{b})=\hat{b}(m-1)+\hat{b}(m-2)$, and $\hat{b}(m)=\text{sgn}[z(m)-\hat{b}(m-1)+\hat{b}(m-2)+\hat{b}(m-3)]$, where $\text{sgn}[x]$ is defined as $+1$ for $x\geq 0$ and $-1$ for $x\leq 0$;

for said $E^2$PR4 type signal said $\hat{d}(m)=(0, \pm 2A, \pm 4A, \text{ or } \pm 6A)$ and said function $v(m,\hat{b})$ is of the form: $v(m,\hat{b})=\hat{b}(m-2)$, and $\hat{b}(m)=\text{sgn}[z(m)-2\hat{b}(m-1)+2\hat{b}(m-3)+\hat{b}(m-4)]$, where $\text{sgn}[x]$ is defined as $+1$ for $x\geq 0$ and $-1$ for $x\leq 0$.

* * * * *